(12) United States Patent
Wasserbauer et al.

(10) Patent No.: US 6,830,940 B1
(45) Date of Patent: Dec. 14, 2004

(54) METHOD AND APPARATUS FOR PERFORMING WHOLE WAFER BURN-IN

(75) Inventors: John Wasserbauer, Erie, CO (US); Stewart A. Feld, Broomfield, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 09/991,568

(22) Filed: Nov. 16, 2001

Related U.S. Application Data

(60) Provisional application No. 60/249,138, filed on Nov. 16, 2000.

(51) Int. Cl.[7] .............................................. H01L 21/00
(52) U.S. Cl. .............................. 438/14; 438/17; 438/19
(58) Field of Search ............................... 438/14, 17, 19, 438/21, 34, 72, 15, 6, 18, 20; 430/315, 396; 324/765, 754, 757, 758, 762, 760

(56) References Cited

U.S. PATENT DOCUMENTS

| | | | | |
|---|---|---|---|---|
| 5,103,557 A | * | 4/1992 | Leedy | .......................... 438/6 |
| 5,725,995 A | * | 3/1998 | Leedy | .......................... 430/315 |
| 6,288,561 B1 | * | 9/2001 | Leedy | .......................... 324/760 |
| 6,351,134 B2 | * | 2/2002 | Leas et al. | ................... 324/765 |
| 6,469,785 B1 | * | 10/2002 | Duveneck et al. | .......... 356/244 |

* cited by examiner

*Primary Examiner*—Carl Whitehead, Jr.
*Assistant Examiner*—Laura M Schillinger
(74) *Attorney, Agent, or Firm*—Barlow, Josephs & Holmes, Ltd.

(57) ABSTRACT

A method and apparatus for burning in a semiconductor wafer having a plurality of active devices utilizes temporary conductive interconnect layers to separately couple at least a portion of the anodes of the active devices together as well as at least a portion of the cathodes of the devices together. A simplified probed pad, having a reduced number of contacts may then be utilized to apply a substantially constant voltage or current to the devices. The temporary conductive interconnect layer may be patterned to include device level resistors or array level resistors that may be used to mitigate the effects of short circuits or open circuits on the processing of the devices.

5 Claims, 23 Drawing Sheets

METHOD AND APPARATUS FOR PERFORMING WHOLE WAFER BURN-IN

CROSS-REFERENCE TO RELATED APPLICATION

This application claims priority to U.S. Provisional Patent application Ser. No. 60/249,138, entitled "METHOD FOR WHOLE WAFER BURN-IN" filed on Nov. 16, 2000 the content of which is incorporated herein by reference.

FIELD OF THE INVENTION

This invention generally relates to methods for processing semiconductor wafers and more particularly to a method and apparatus for burning-in or stressing an entire wafer or some portion thereof.

BACKGROUND

Semiconductor lasers are widely used in applications such as optical communications. The edge emitting laser diode is a semiconductor laser that emits light from a plane that is a continuation of the p-n junction of the diode. Cleaved surfaces at the ends of the diode act as mirrors that together define an optical cavity. Optical feedback provided by the cleaved mirrors creates a resonance of the emitted light that results in lasing. Because of this, the wafer must be cleaved prior to testing or stressing of the devices.

The vertical cavity surface emitting laser (VCSEL) is another type of semiconductor laser in which the optical cavity is normal to the p-n junction of the semiconductor wafer from which it was fabricated. Ordinarily VCSELs are manufactured with many layers of semiconductor material deposited upon the substrate. VCSELs typically include highly reflective optical mirrors above and below the active layer which, in contrast to the edge emitting laser, enable laser output normal to the surface of the wafer. As a result, a VCSEL may be tested or stressed while the wafer is intact. VCSELs are also efficient, small in size, readily assembled into arrays, and easy to manufacture.

Therefore, VCSELs have become preferred in today's optoelectronics. Because of their complexity, however, existing processes for manufacturing edge emitters or VCSELs do not always yield devices with consistent characteristics. The process involves many layers that depend on numerous parameters including, but not limited to, doping concentration, substrate temperature, material sources, and growth rate.

Therefore, manufacturers of semiconductor lasers often use a burn-in procedure to cause device performance characteristics to stabilize and to induce early failure of weak devices. Both of these effects usually occur sometime after power has been applied to the device under operating conditions. Burn-in testing is typically conducted on individual active devices at elevated temperatures for prolonged periods of time (e.g., 40–80 hours). This requires the expenditure of additional time to fully verify each of a large number of active devices on a wafer or the development of a relatively complicated and costly probe assembly with numerous contact electrodes that may individually contacting each of the active devices on the wafer.

Ideally, burn-in stressing is conducted prior to integrating the device into a sub-assembly, module or system. This is because at each higher level of integration, the cost of a latent failure increases. For example, a latent failure on single device results in only a minor cost. However the failure of a single device in a subassembly may result in the rejection of the entire subassembly, at a cost many times that of the VCSEL die. Likewise, the failure of a single device in a module results in the rejection or rework of the entire module, at a cost many times that of the subassembly.

SUMMARY OF THE INVENTION

In one aspect of the present invention a method and apparatus for burning in a semiconductor wafer having a plurality of active devices utilizes temporary conductive interconnect layers. The interconnect layers may separately couple at least a portion of the anodes of the active devices together and or at least a portion of the cathodes of the devices together. A simplified probed pad, having a reduced number of contacts may then be utilized to apply a substantially constant voltage or current to the devices. In another aspect of the present invention device or array level resistors may be integrated in series with the active devices to mitigate the effects of short circuits or open circuits on the processing of the devices.

In another aspect of the present invention a process for burning in a wafer having a plurality of active device, wherein each device has a first and a second electrode, includes depositing an insulator layer adjacent one side of the wafer. Vias may be formed in the insulator layer to provide access to at least one of the electrode of the active devices., A conductive interconnect layer may be deposited adjacent the insulator layer, wherein said conductive interconnect layer is electrically couples together at least the first electrode of at least a portion of the active devices.

In another aspect of the present invention a method for burning in a wafer having a plurality of active device, wherein each device has a first and second electrode, includes depositing an insulator layer adjacent one side of the wafer, forming a conductive interconnect layer adjacent the insulator layer. The conductive interconnect layer may be processed to form a plurality of first electrode contact traces wherein each of the first electrode contact traces separately couples together the first electrode of each active device within an array. The conductive interconnect layer may be further processed to form a plurality of second electrode contact traces wherein the second electrode contact traces simultaneously couple together the second electrode of at least a portion of said active devices.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

An exemplary embodiment of the present invention provides an apparatus and method for burn-in testing of a semiconductor wafer having a plurality of active devices. An exemplary process for performing whole wafer burn-in may be utilized to simultaneously contact substantially all the active devices on the wafer and to drive each of the active devices with an operating current at a reduced or elevated temperature.

As is known in the art, semiconductor active devices such as, for example, semiconductor lasers may be electrically contacted in accordance with a variety of schemes to support for example, top or bottom emission, intra-cavity contacts, etc. Therefore, the described exemplary process may be utilized to burn-in devices having dual top or bottom side electrodes or electrodes on opposite sides of the wafer. The advantages of the present invention may therefore be best understood in the context of an illustrative light emitting device that may be processed in accordance with the exemplary process.

Figure 1:
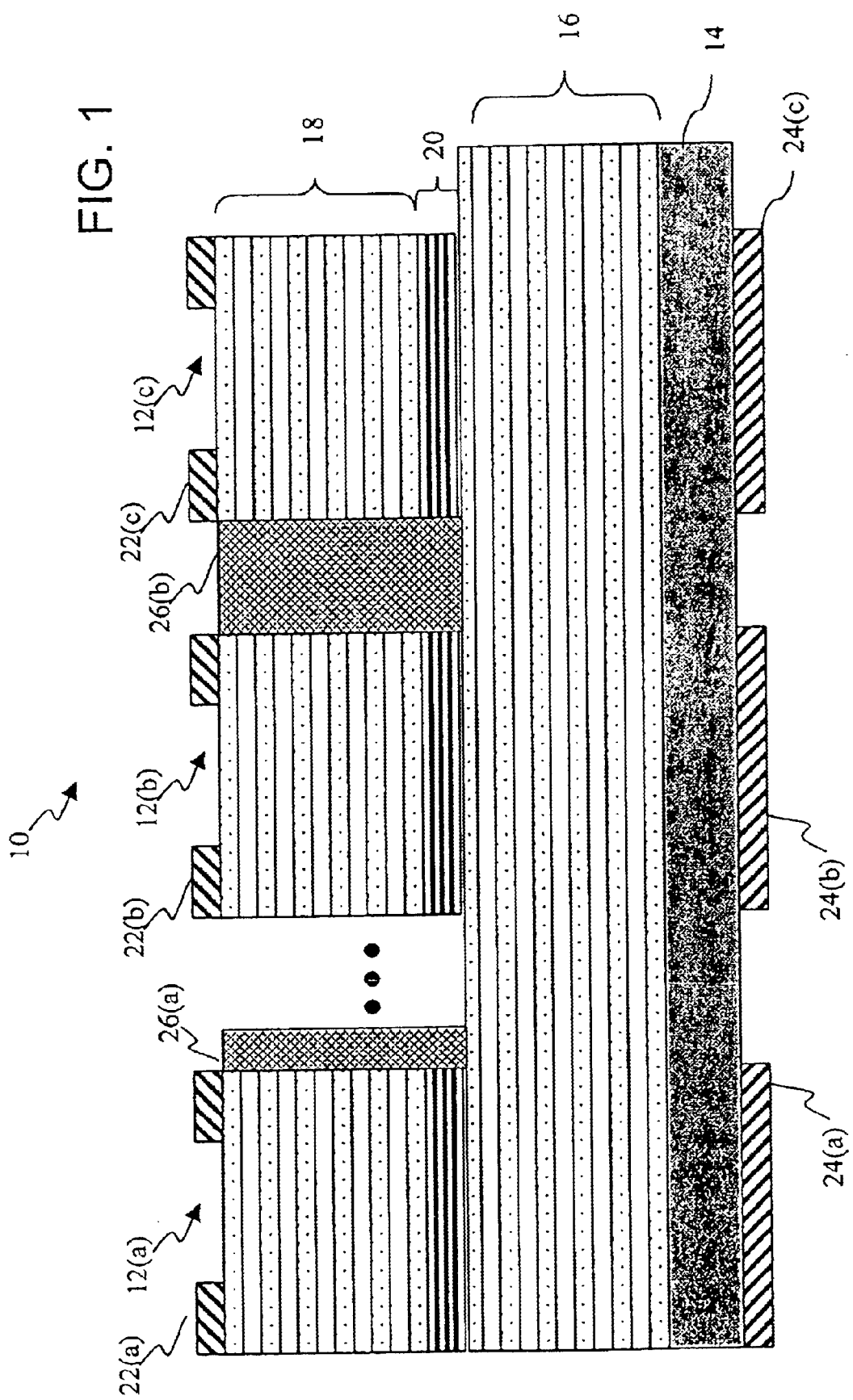
FIG. 1 is a cross section of an illustrative light emitting device having electrodes on opposite sides of the wafer.

For example, referring to the cross-section of FIG. 1, the described exemplary burn-in process may be utilized to burn-in or purge a wafer 10 comprising a plurality of light emitting devices, two of which are shown for purposes of clarity, 12(*a*), 12(*b*) and 12(*c*). In one embodiment each device may be formed from a layered structure in which lasing light is emitted in a vertical direction that is perpendicular to the plane of the layers. The described exemplary light-emitting devices 12(*a*–*c*) may be formed from type III–V or II–VI compound semiconductor materials with embodiments of the invention being in the form of a vertical-cavity surface-emitting laser (VCSEL).

The semiconductor light-emitting devices 12(*a*–*c*) comprise a plurality of compound semiconductor layers epitaxially-grown on a semiconductor substrate 14. In an exemplary embodiment the semiconductor layers form a lower mirror stack 16 above the substrate 14, an upper mirror stack 18 above the lower mirror stack and an optical cavity 20 sandwiched between the mirror stacks. In the described illustrative structure the light emitting devices 12(*a*–*c*) on the wafer may be contacted with upper and lower electrodes 22(*a*), 22(*b*), 22(*c*) and 24(*a*), 24(*b*) and 24(*c*) deposited above the upper mirror 18 and below the substrate 14 respectively.

The wafer may be formed into discrete lasers by a combination of current confinement and ohmic contacts or electrodes. Current confinement may be achieved by forming a high resistance implant region 26(*a*) and 26(*b*) within the layers of the device as is known in the art. Alternatively, the individual devices may be defined by etching away the upper mirror layers and optical cavity to define a mesa structure as is known in the art.

One of ordinary skill in the art will appreciate that the present invention is not limited to the disclosed illustrative light emitting device. Rather the present invention may be utilized to burn-in all semiconductor wafers having a plurality of active devices each of which has electrodes on the opposite side of the wafer. The disclosed illustrative VCSEL of FIG. 1 is therefore by way of example only and not by way of limitation.

Figure 2:
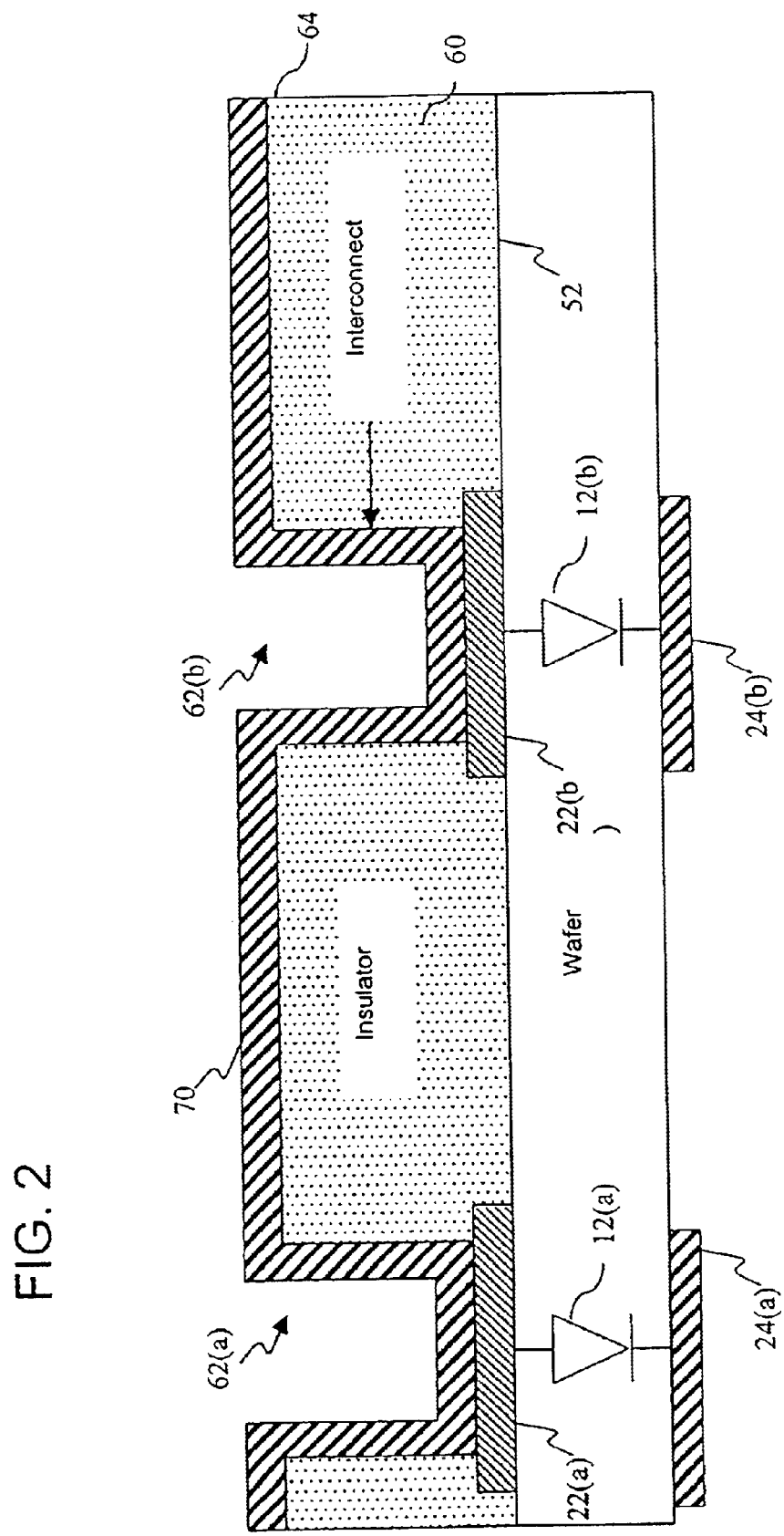
FIG. 2 is a simplified cross-section of the light emitting device of FIG. 1 including a temporary interconnect scheme simultaneously contacting the electrodes on opposite sides of the wafer in accordance with an exemplary process of the present invention.

Referring to FIG. 2, an exemplary process for burning-in the wafer illustrated in FIG. 1, simultaneously contacts substantially all of the laser devices on the wafer, two of which 12(*a*) and 12(*b*) are illustrated for purposes of clarity. The disclosed exemplary process may then simultaneously drive each of the laser devices with an operating current at an elevated or a reduced temperature.

In accordance with an exemplary process an insulator layer 60 such as, for example, photo resist may be deposited across the upper surface 52 of the wafer. Vias 62(*a*) and 62(*b*) may then be formed in the insulator layer 60 to provide access to the upper contacts. In the described exemplary process a first temporary conductive interconnect layer 70, such as, for example, Ti/Au, may be deposited across the upper surface 64 of the insulator layer to electrically contact each of the upper electrodes.

Figure 3:
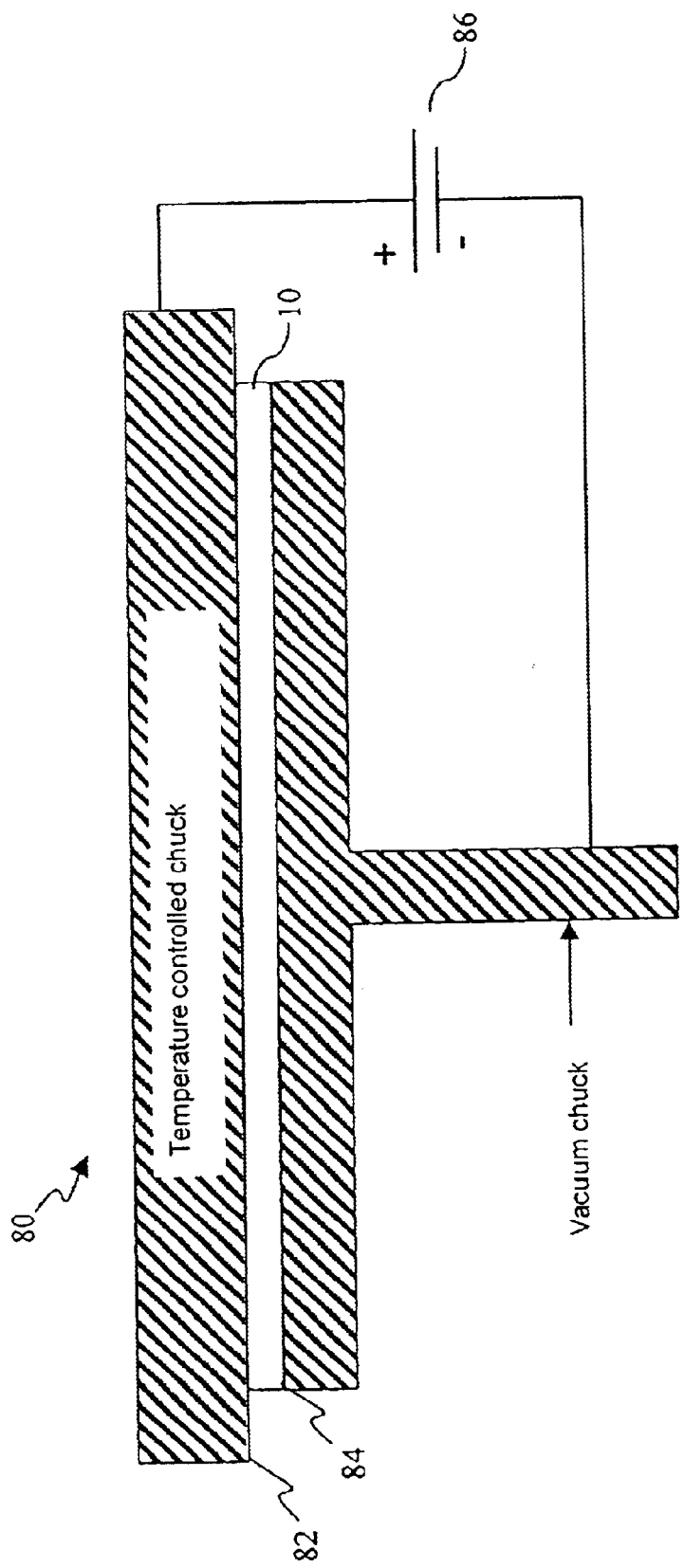
FIG. 3 is a cross-sectional view of a test fixture for burning-in or stressing a wafer processed in accordance with the temporary interconnect scheme illustrated in FIG. 2, in accordance with an exemplary process of the present invention.

Referring to FIG. 3, in accordance with an exemplary process the wafer processed as in FIG. 2 may then be placed in a temperature controlled chuck 80 having two substantially planar surface 82 and 84 that electrically contact interconnect layers 70 and 72 respectively. In accordance with an exemplary process the chuck may be coupled to a calibrated power source such as a constant voltage source (or constant current source). The power source may apply a substantially uniform voltage across each of the devices or drive each of the devices a substantially uniform current at an elevated or reduced temperature for a predetermined time. Subsequent to burn-in the sacrificial Ti/Au interconnect layers 70 and 72 and insulator layer 60 may be removed by known techniques.

Figure 4:
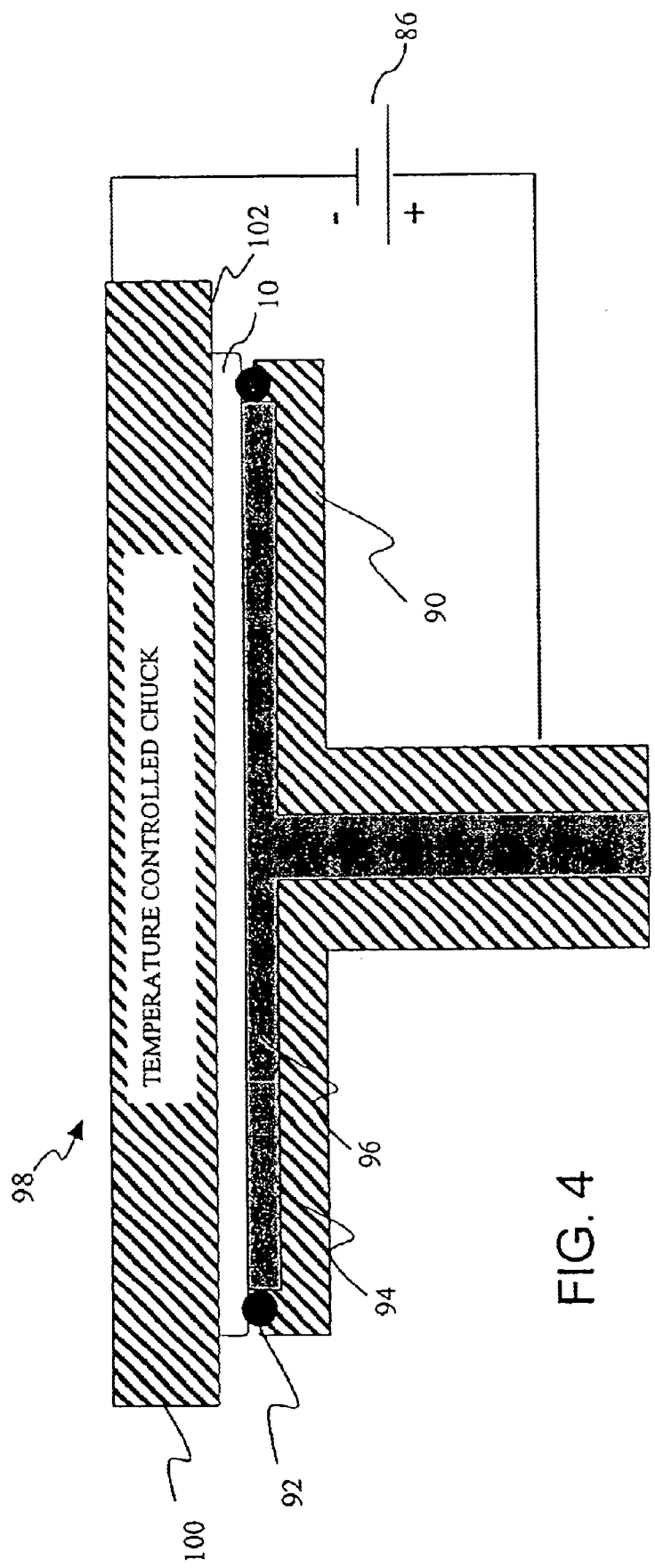
FIG. 4 is a cross-sectional view of alternate test fixture for burning-in or stressing a wafer processed in accordance with the temporary interconnect scheme illustrated in FIG. 2, wherein a conductive liquid is used to simultaneously contact all electrodes on ones side of the wafer, in accordance with an exemplary process of the present invention.

Another process for burning-in a wafer having a plurality of devices contacted on opposite sides of the wafer may include a liquid contact within a test apparatus in lieu of the sacrificial Ti/Au upper interconnect layer 70 as illustrated in FIG. 2. Referring to FIG. 4, in this embodiment, a lower chuck 90 may include a seal 92, such as for example, an O-ring around a cavity 94 formed in the lower chuck 90. In accordance with an exemplary process the cavity 94 may be filled with a conductive liquid 96, such as, for example, mercury. The wafer 10 may be inserted in the fixture 98 with the upper surface of the wafer contacting the seal 92 along the perimeter of the wafer.

In accordance with an exemplary process upper chuck 100 having a substantially planar, conductive surface 102 may contact the lower surface of the wafer. The conductive liquid 96 is then pressurized bringing the conductive liquid 96 into contact with the upper electrode of each device. Each of the devices 12(*a*) and 12(*b*) (see FIG. 2) on the wafer may then again be driven with the desired current at elevated or reduced temperature.

The present invention is not limited to processing devices having electrodes on opposite sides of the wafer. Rather, the present invention may also be utilized to burn-in devices having both electrodes on the same side of the wafer.

Figure 5:
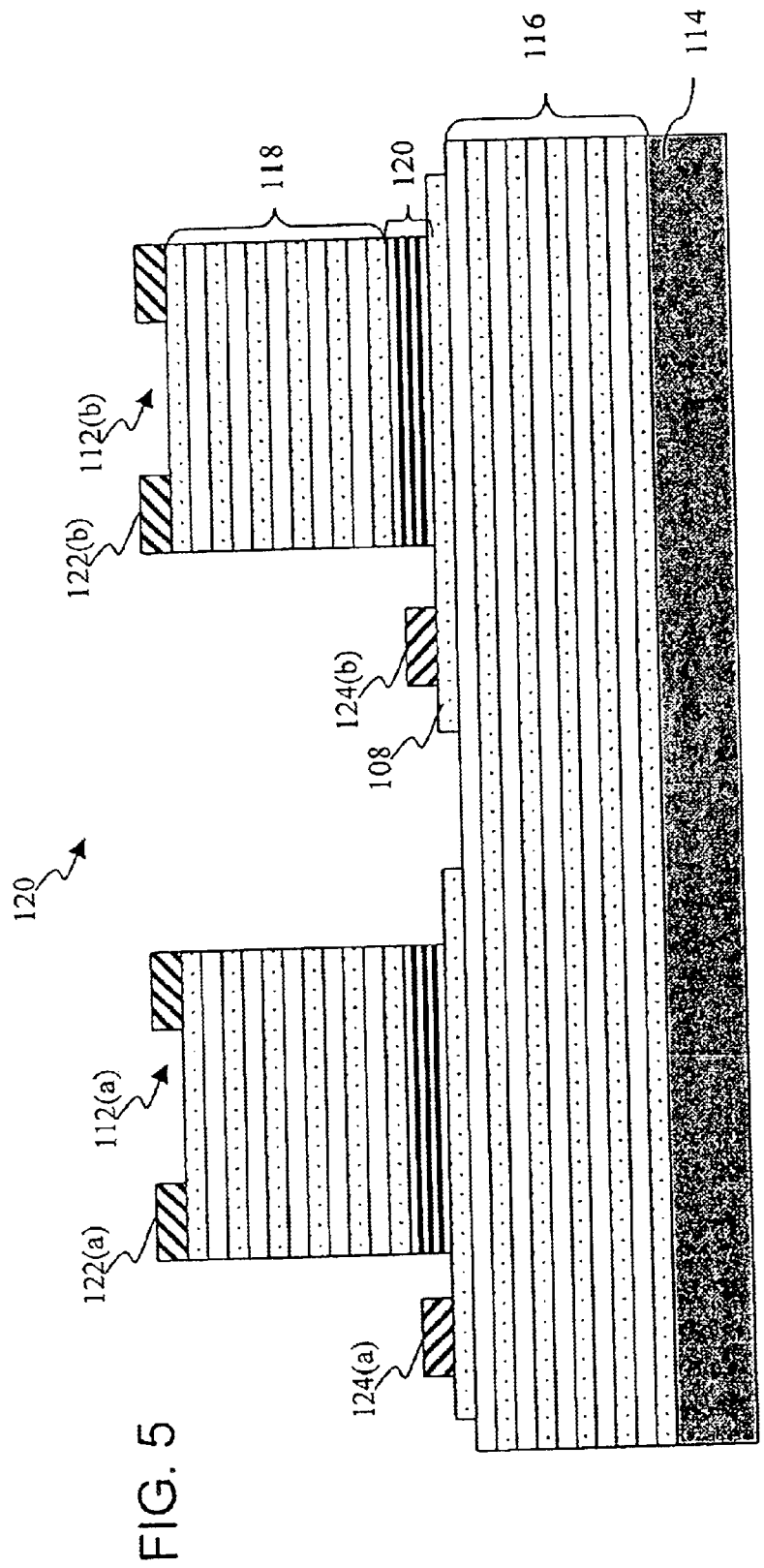
FIG. 5 is a cross-section of an illustrative light emitting device having two electrode the same side of the wafer.

An illustrative structure for use in the described exemplary process is illustrated in the cross-section of FIG. 5. The described illustrative VCSEL structure may comprise a layered structure epitaxially-grown on a semiconductor substrate. The illustrative wafer 110 may include a plurality of VCSELS, two of which are shown for purposes of clarity, 112(*a*) and 112(*b*). Each of the VCSELs may comprise a lower mirror stack 116 formed above a semi-insulating substrate 114 and a contact layer 108 formed above the lower mirror stack 116 and below optical cavity 120. Further an upper mirror stack 118 may be formed above the optical cavity.

In the described illustrative structure the semiconductor layers are etched downward to provide access to an upper surface of the contact layer 106 forming a mesa that defines the individual devices on the wafer. The contact layer 108 may be heavily doped with a suitable dopant type that matches that of the lower mirror.

In the described illustrative structure the light emitting devices 112(*a*) and 112(*b*) on the wafer may be contacted with upper and lower electrodes 122(*a*), 122(*b*) and 124(*a*) and 124(*b*) deposited above the upper mirror 118 and above the contact layer 108, respectively. The contact layer 108 may be incorporated to reduce the contact resistance of the lower electrode.

One of skill in the art will appreciate that the present invention is not limited to the disclosed illustrative light emitting device. Rather the present invention may be utilized to burn-in all semiconductor wafers having a plurality of active devices with electrodes on the same side of the wafer. The disclosed illustrative VCSEL of FIG. 5 is therefore by way of example only and not by way of limitation.

Figure 6:
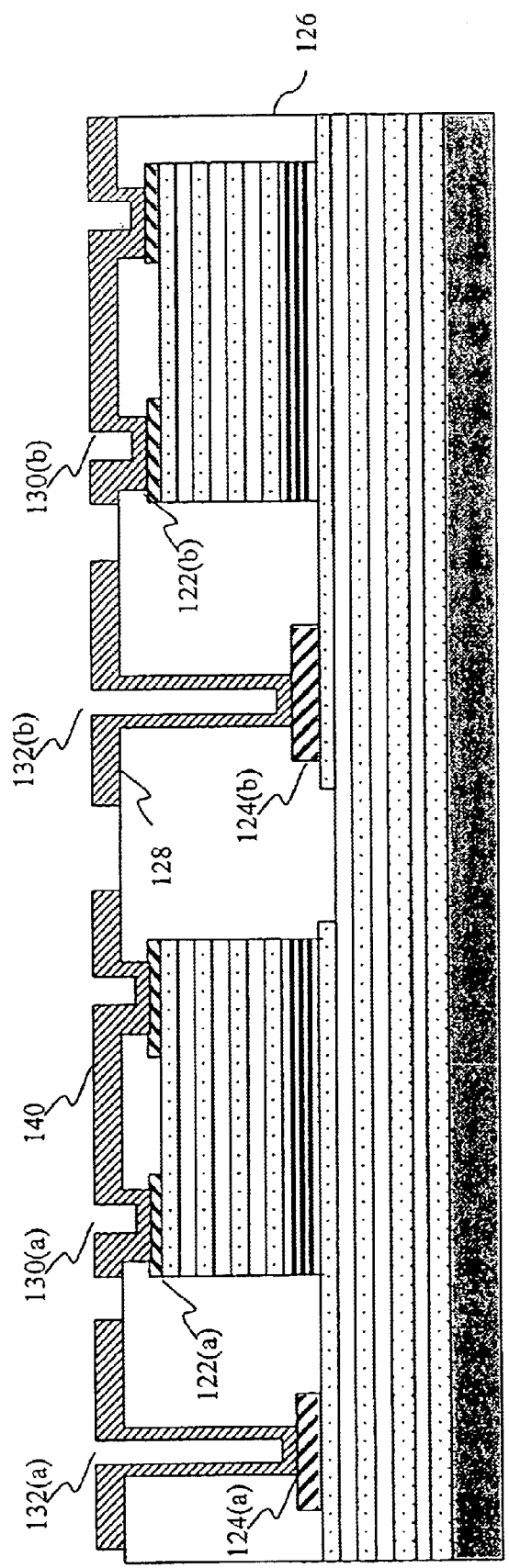
FIG. 6 is a cross-sectional view of the device illustrated in FIG. 5 having an interconnection layer that simultaneously contacts all of the electrodes of the light emitting device in accordance with an exemplary embodiment of the present invention.

Referring to FIG. 6, in an exemplary process a suitable insulator layer 126, such as for example, photo resist, polyamide, or dielectric is deposited across the upper surface of the wafer. In accordance with an exemplary embodiment the insulator layer 126 largely planarizes the upper surface of the wafer creating a substantially planar upper surface 128. Separate vias 130(*a*), 130(*b*) and 132(*a*), 132(*b*) may then be formed in the insulator layer 126 to provide access to the upper and lower electrodes 122(*a*), 122(*b*) and 124(*a*), 124(*b*) respectively. In the described exemplary process, a temporary conductive interconnect layer 140, such as, for example, Ti/Au, may be deposited adjacent the upper surface 128 of the insulator layer.

In an exemplary process temporary conductive interconnect layer 140 electrically contacts each of the upper electrodes 122(*a*), 122(*b*) as well as each of the lower electrodes 124(*a*), 124(*b*). One of skill in the art will appreciate that the conductive interconnect layer 140 may be patterned to separately contact all of the upper electrodes and all of the lower electrodes as two large groups or some subcombination thereof.

Figure 7:
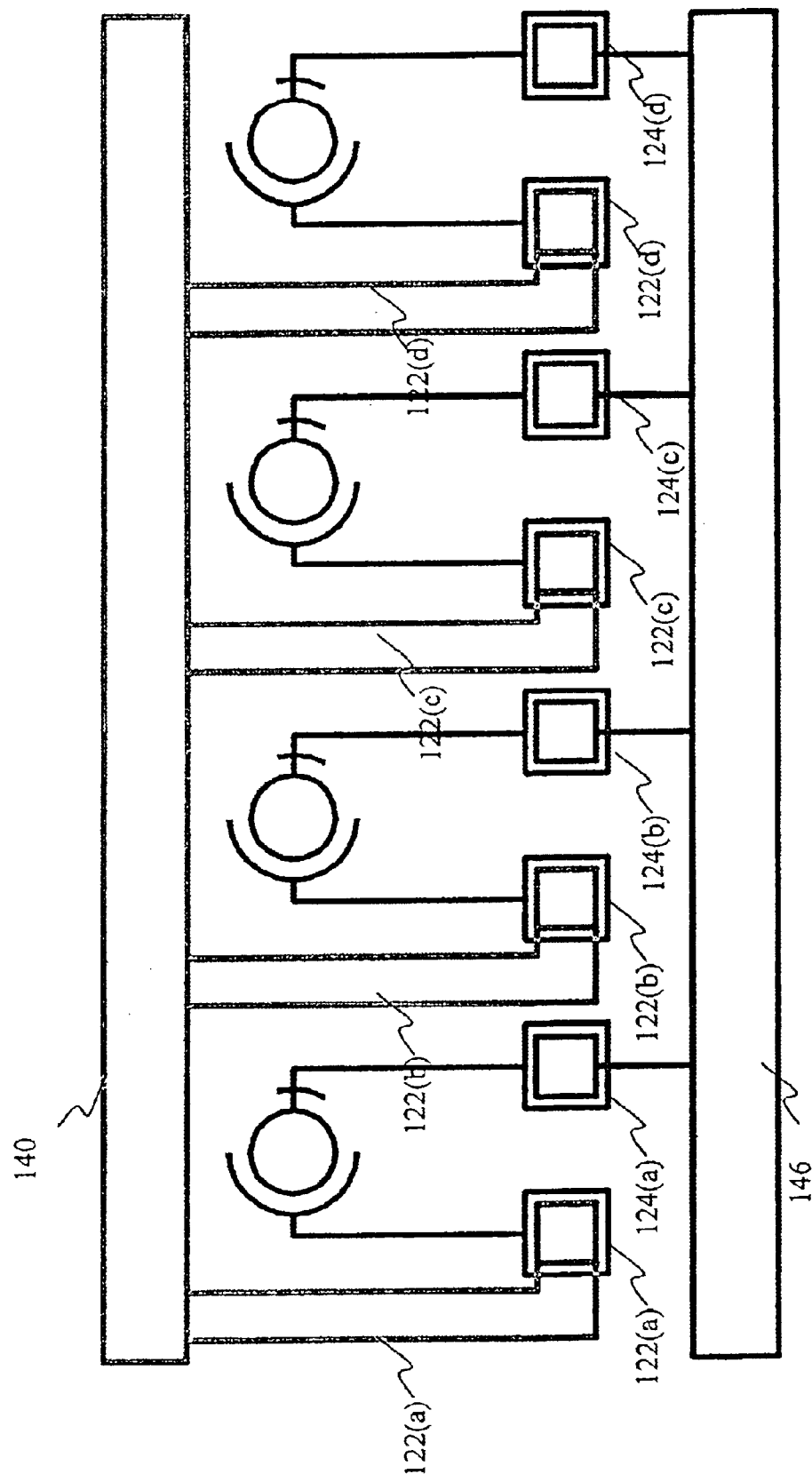
FIG. 7 graphically illustrates a device-level view of an exemplary mask layout scheme for patterning the interconnection layer of FIG. 6 to provide separate, simultaneous connection to the electrodes of the light emitting device, in accordance with an exemplary embodiment of the present invention.

For example, FIG. 7 graphically illustrates a device level view of an exemplary mask layout for generating a temporary conductive interconnect layer on a wafer having both electrodes on the same side of the wafer as illustrated in FIG. 6. In accordance with an exemplary process the upper electrodes 122(*a–d*) and lower electrodes 124(*a–d*) may be coupled together through separate vias.

Figure 8:
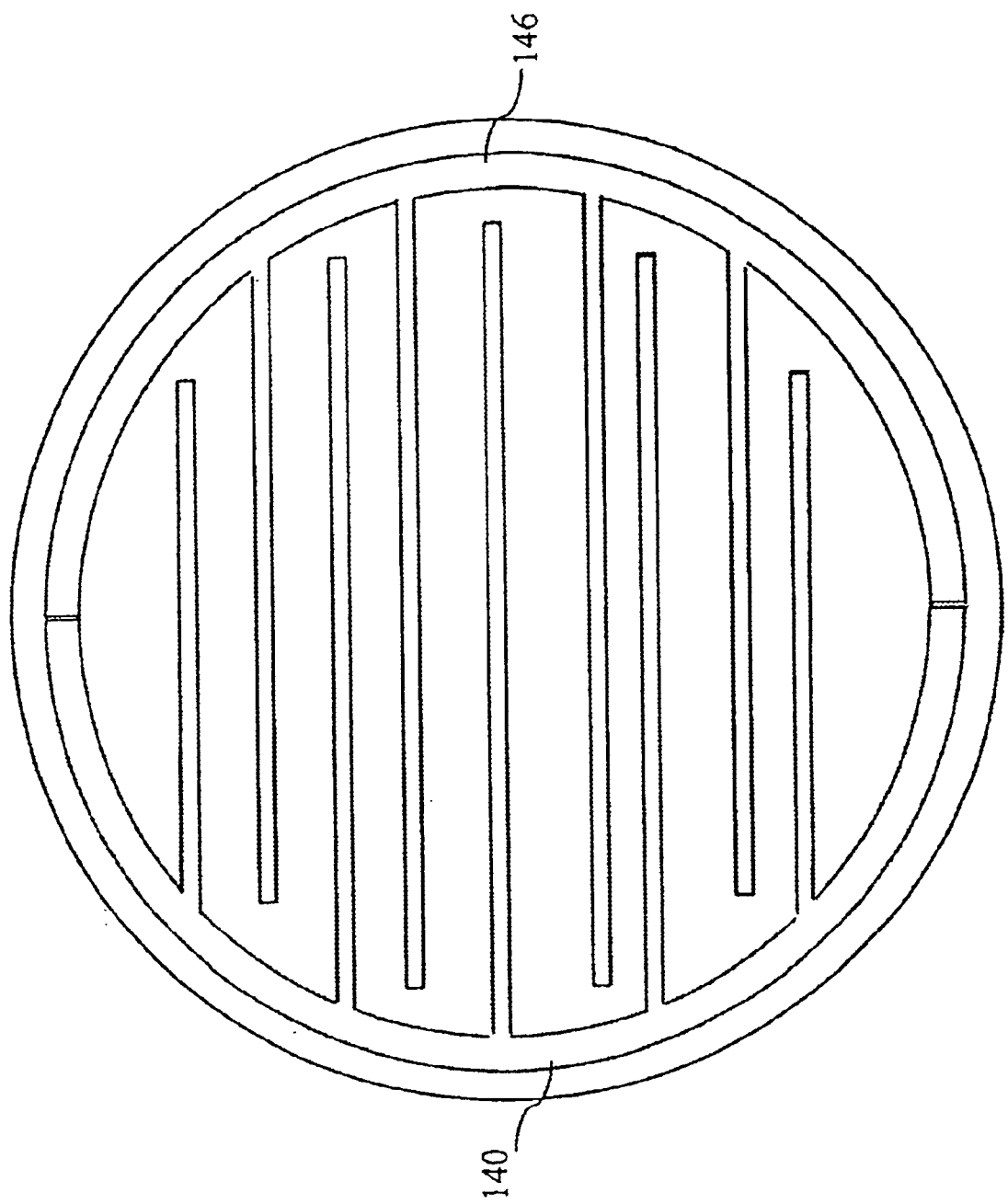
FIG. 8 is a top view of a single-level temporary interconnect scheme for separate, simultaneous connection to the electrodes of the light emitting device of FIG. 5, in accordance with an exemplary embodiment of the present invention.

In this embodiment, the temporary conductive interconnect layer may be patterned to form a common upper electrode contact trace 146 that simultaneously couples all the upper electrodes together. Similarly, the temporary conductive interconnect layer may be further patterned to form a common lower electrode contact trace 140 that simultaneously couples all the lower electrodes together. In the described exemplary embodiment, the common upper electrode contact trace 146 is electrically isolated from the common lower electrode contact trace 140 as illustrated in the top view of FIG. 8.

Figure 9:
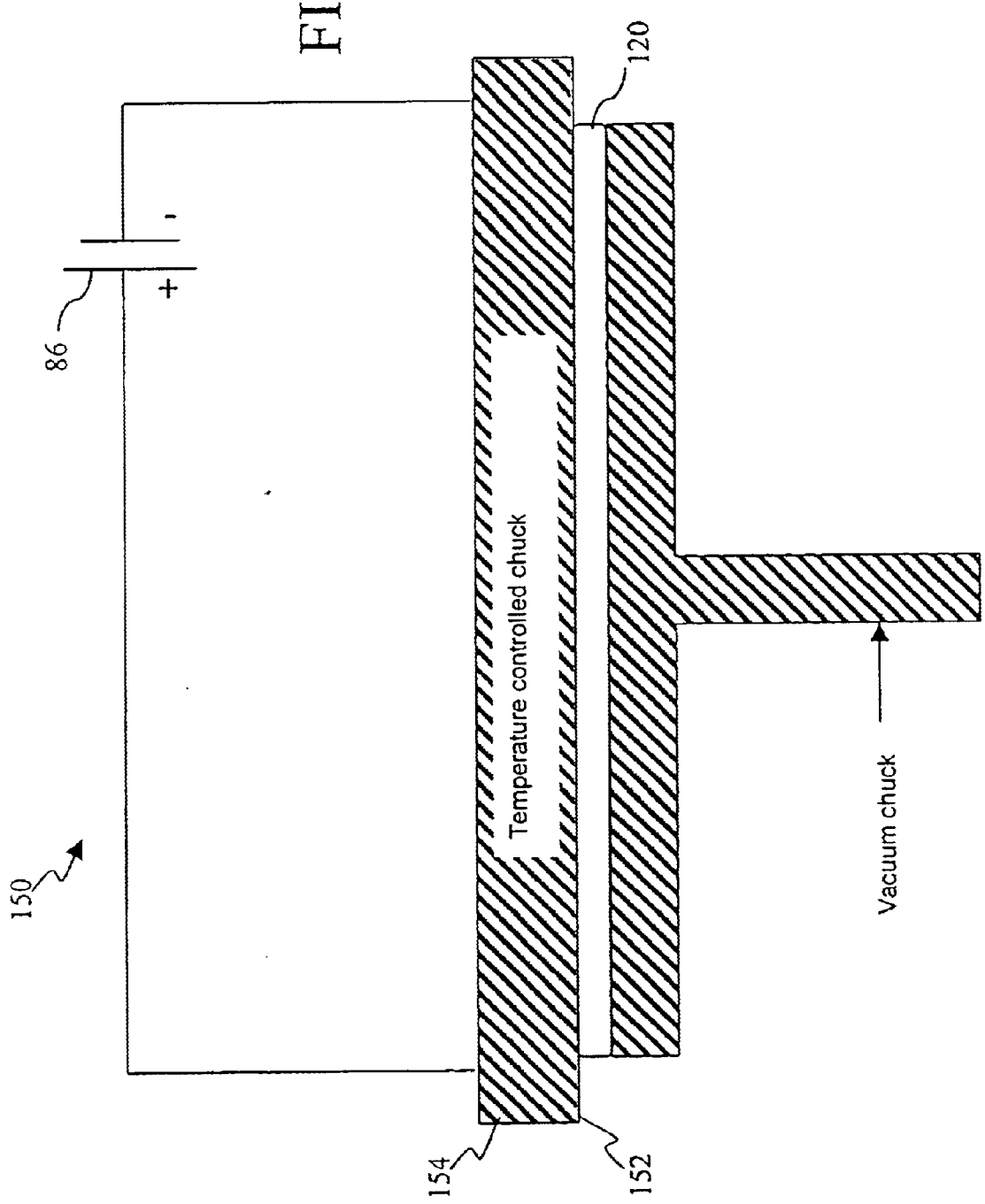
FIG. 9 is a cross sectional view a test fixture for burning-in or stressing a wafer processed in accordance with the temporary interconnect scheme illustrated in FIG. 8, in accordance with an exemplary process of the present invention.

In accordance with an exemplary burn-in process, the wafer may then be placed in a temperature chuck as shown in FIG. 9. In the described exemplary process an upper surface of the chuck 150 of upper chuck 154 comprises two electrically isolated contacts (not shown) shaped to separately couple to the conductive interconnect layers 140 and 146 illustrated in FIG. 8. Each of the devices may again be driven with the desired current at elevated or reduced temperature. Subsequent to wafer burn-in the sacrificial Ti/Au interconnect layer and insulator layer may be removed by known techniques. However, in the described exemplary single layer interconnection scheme it may be difficult to repair or to compensate for short that may be formed in the interconnect metal itself.

Figure 10:
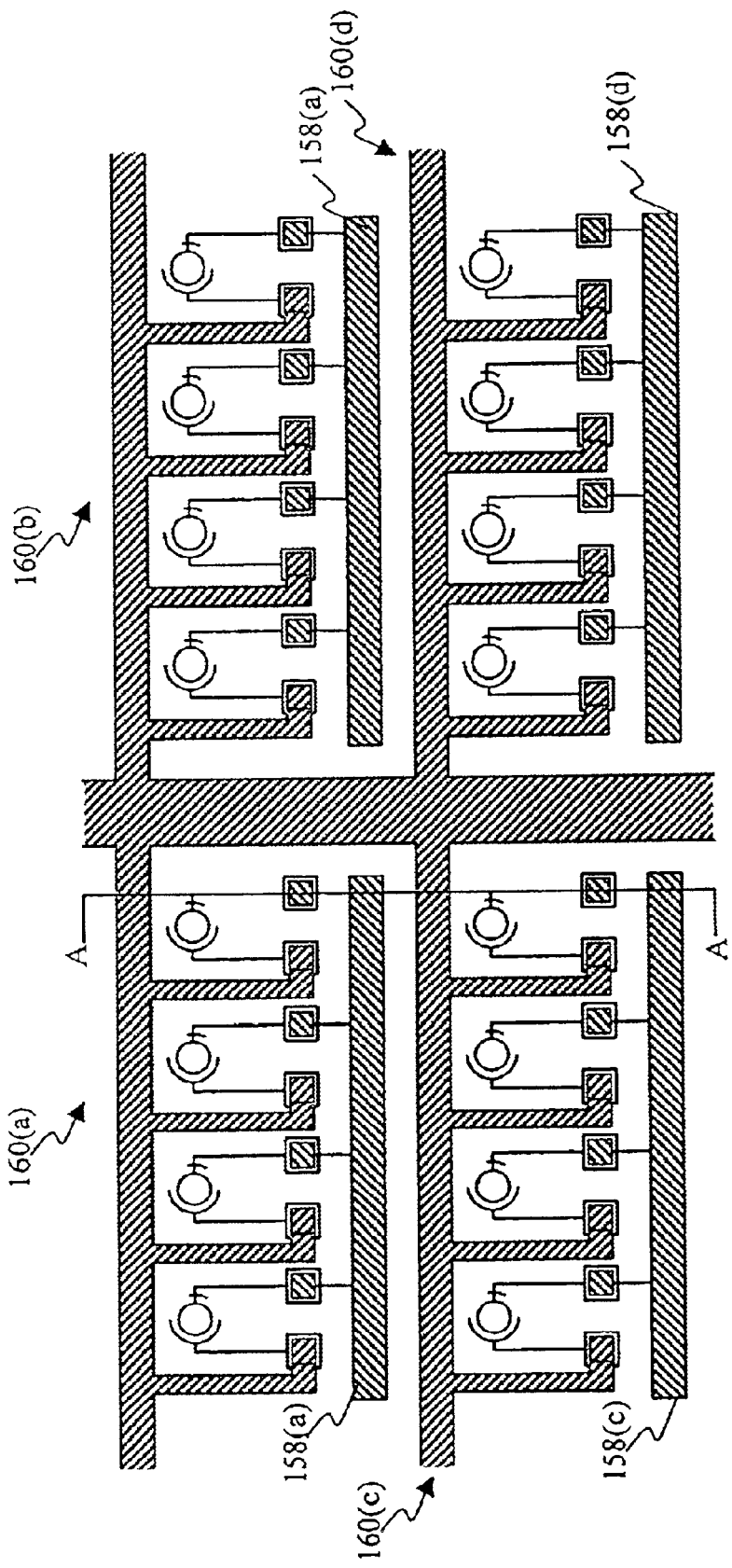
FIG. 10 is an array level top view of a mask layout scheme for a first metal interconnect layer in a two level interconnect scheme for separate, simultaneous connection to the electrodes of the light emitting device of FIG. 5, in accordance with an exemplary embodiment of the present invention.

Therefore, in accordance with another exemplary process for burning-in a wafer as illustrated in FIG. 6, separate portions. 160(*a–d*) of the upper or lower electrodes may be separately coupled together with common contact traces 158(*a–d*) as illustrated in FIG. 10. Referring to the top view of FIG. 11, in accordance with an exemplary process, the first level conductive interconnect layer 140 (see FIG. 6) may be patterned to form common contact traces 158(*a–h*) that separately couple groups of one type of electrode, for example, the upper electrodes.

The first level metal interconnect layer may be further patterned to provide a second common contact trace 162 that simultaneously couples all of the second type of electrodes, for example the lower electrodes. In the described exemplary process the second common contact trace may comprise, for example, a ring contact on the periphery of the wafer that electrically couples a plurality of common lower electrode contact traces 166(*a–j*) to all of the lower electrodes.

Figure 12:
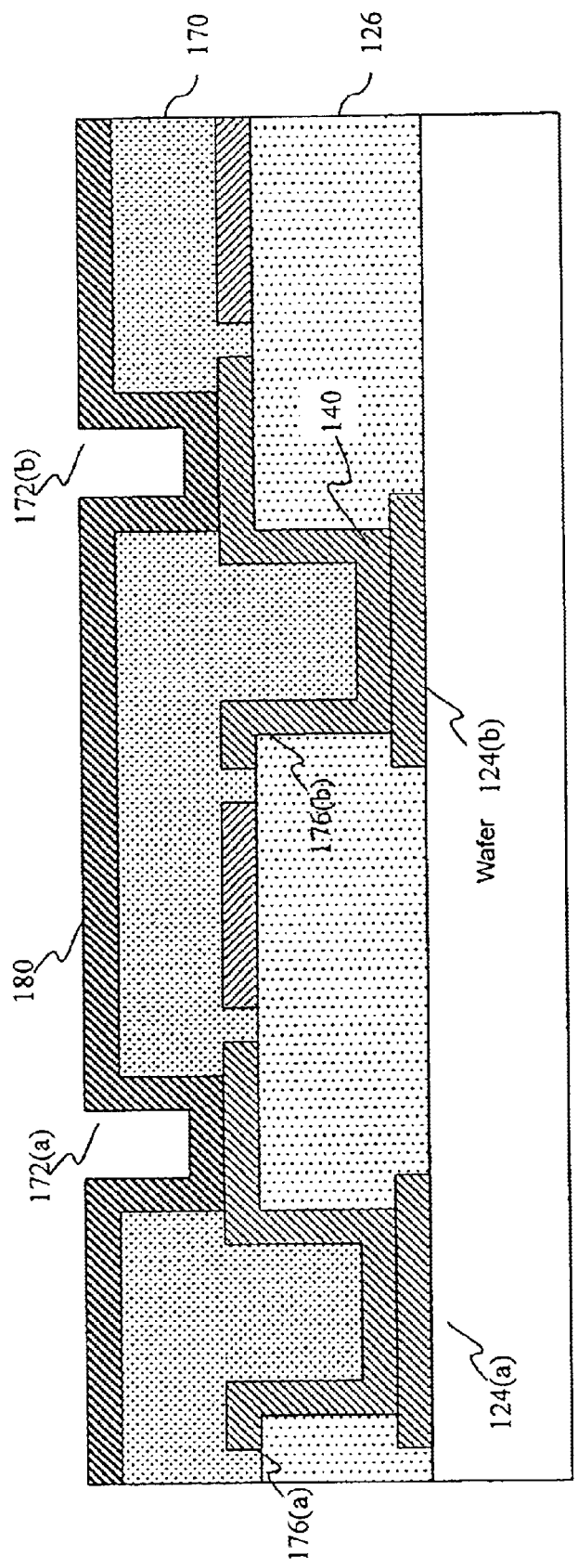
FIG. 12 is a cross sectional view of a two level interconnect scheme for separate, simultaneous connection to the electrodes of the light emitting device of FIG. 5, in accordance with an exemplary embodiment of the present invention.

FIG. 12 is a cross-sectional view taken through section A—A of FIG. 10 illustrating the application of a second insulator layer 170 over the upper surface of the first metal interconnect layer. Vias 172(*a*) and 172(*b*) may then be formed in the second insulator layer 170 to provide access to that portion of the first conductive interconnect layer 176(*a*) and 176(*b*) that contacts the lower electrodes 124(*a*) and 124(*b*). In accordance with an exemplary process, a second conductive interconnect layer 180, such as, for example Ti/Au, may be deposited on the upper surface of the second insulator layer 170.

Figure 13:
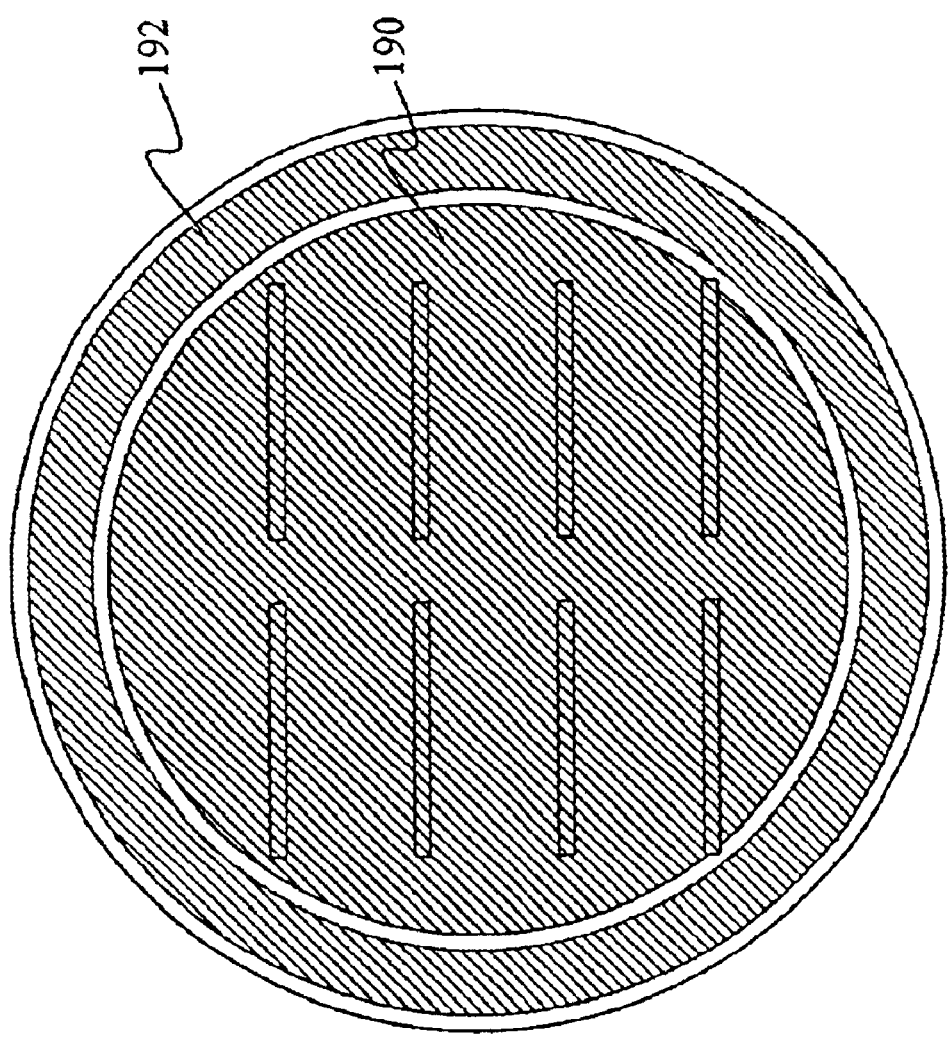
FIG. 13 is a top view of a second temporary interconnect layer in a two level interconnect scheme for separate, simultaneous connection to the electrodes of the light emitting device of FIG. 5, in accordance with an exemplary embodiment of the present invention.

In the described exemplary process the second conductive interconnect layer 180 may be patterned to provide a single electrical contact 190 for all of the lower electrodes, as illustrated in the top view of FIG. 13. The second conductive interconnect layer 180 may be further patterned to also provide a second, spatially separate contact 192 for all of the upper electrodes. In the described exemplary process, a single, two-electrode external contact may therefore be used to provide electrical power to the entire wafer.

One of skill in the art will appreciate that the geometric shape of the patterned conductive interconnect layers is not limited to that disclosed in the described exemplary process. Rather, the conductive interconnect layer may be processed to have a variety of shapes that allow the wafer to be externally contacted with a single, two-electrode contact. The shape of the illustrated metal interconnect layers is therefore by way of example only, and not by way of limitation.

Figure 14:
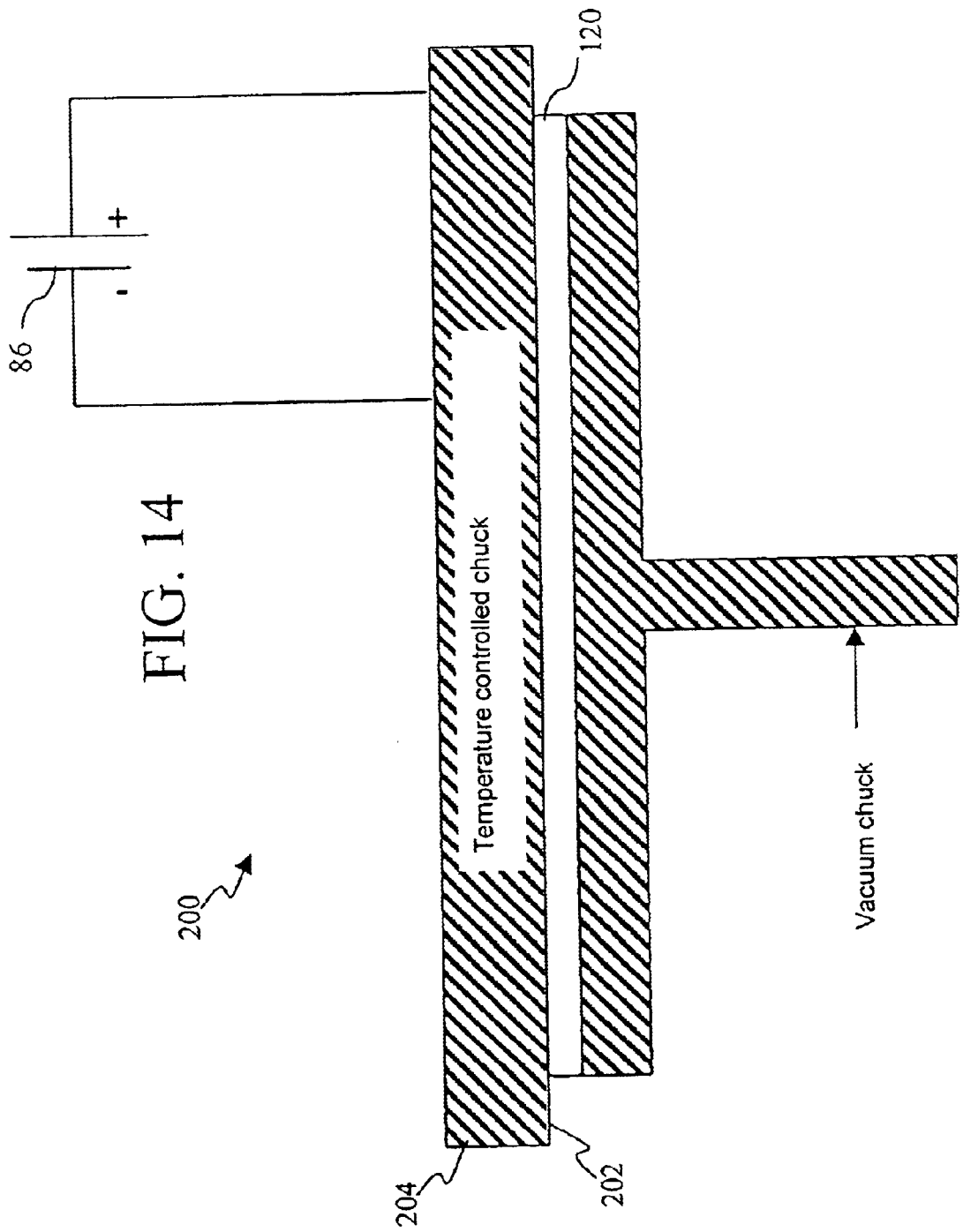
FIG. 14 is a cross sectional view of a test fixture for burning-in or stressing a wafer processed in accordance with the temporary interconnect scheme illustrated in FIG. 5, in accordance with an exemplary embodiment of the present invention.

The wafer may then be placed in a temperature chuck 200 as illustrated in FIG. 14. In accordance with an exemplary process an upper surface 202 of the upper chuck 204 comprises two electrically isolated contacts (not shown) shaped to separately couple to the contact areas 190 and 192 (see FIG. 13) formed in the described exemplary second conductive interconnect layer. All of the devices on the wafer may then again be driven with the desired current at elevated or reduced temperature. Subsequent to wafer burn-in the sacrificial Ti/Au interconnect layers and insulator layers may be removed by known techniques.

In the described exemplary wafer-level burn-in systems the external contacts are designed to make good electrical and thermal contact to the entire wafer surface. In one embodiment, the external contacts may be machined metal, such as, for example, a vacuum chuck. However, in an alternative embodiment a compliant layer may be added between the contact surface of the chuck and wafer to provide sufficient contact over a large area. In one embodiment a roughened or bumpy surface may be employed to force the top-level interconnect to comply with the external contact. Finally, the possibility of liquid contacts has been discussed above.

One of skill in the art will appreciate that the complexity of semiconductor laser processing is such that individual devices or groups of devices may fail. Therefore, the described exemplary processes for burning in multiple devices under test (DUTs) with a single electrical power source may include the ability to detect and or compensate for a variety of failures. For example, the described exemplary burn-in processes may include the ability to detect and or compensate for short circuits and open circuits. Further the described exemplary process may also include the ability to provide substantially uniform current flow to each of the devices under test.

In practice, short circuits and open circuits may result from shorted or opened devices and or shorted or opened probes. In addition, in the two level interconnect process shorted temporary conductive interconnects may also create short circuits. Non-uniform current flow may be caused by a resistive path of non-uniform length or sheet resistance that may result from any of the failures.

In accordance with an exemplary embodiment, a constant voltage source may be utilized to ensure that a substantially uniform current is supplied to all commonly powered devices. However, for devices with non-uniform V–I characteristics, such as, for example, diodes, the current may be difficult to accurately control. In addition the use of a constant voltage source may place significant demands on the power source should a short circuit occur. An alternative burn-in system may utilize a constant current source. Advantageously, a constant current source may be more precisely controlled when non-linear devices, such as, for example, diodes are being powered.

Figure 15:
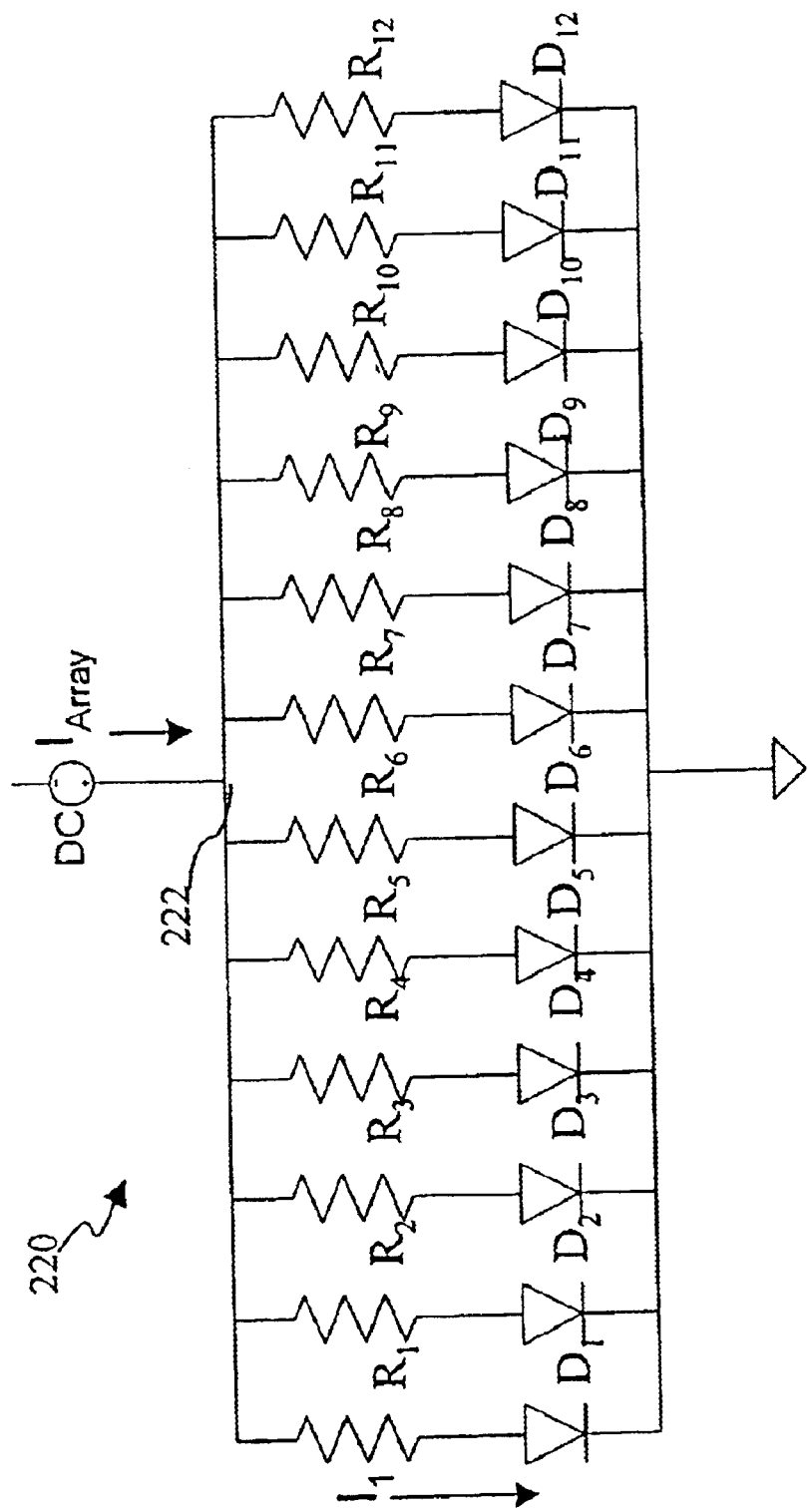
FIG. 15 is a simplified circuit diagram of a DC current source powering a diode array in series with a parallel resistor network in accordance with an exemplary embodiment of the present invention.

An exemplary burn-in system having either a constant voltage source or a constant current source may also utilize a resistor network to spread the current (or voltage) evenly. For example, FIG. 15 illustrates a simplified schematic diagram of a burn-in system 220 supplying current to a 12-element diode array ($D_1$–$D_{12}$) through a 12-element parallel resistor ($R_1$–$R_{12}$) network. One of skill in the art will appreciate that if a uniform voltage needs to be supplied to each of the devices being burned-in, e.g. for a photodiode, then a series resistor network may be used.

In this embodiment if each of the resistors have substantially the same value, and each of the diodes have substantially the same differential resistance, then each channel or diode of the array receives approximately $1/12^{th}$ of the array current, $I_{Array}$. However, if resistance exists between one or more of the diode anode supply lines, then the common anode connection 222 on the supply side of the resistor network is not an equipotential line. In this instance a non-uniform current injection will occur across the device array, in which case an exemplary resistor network may be utilized to mitigate the effect of non-uniform current injection.

Figure 16:
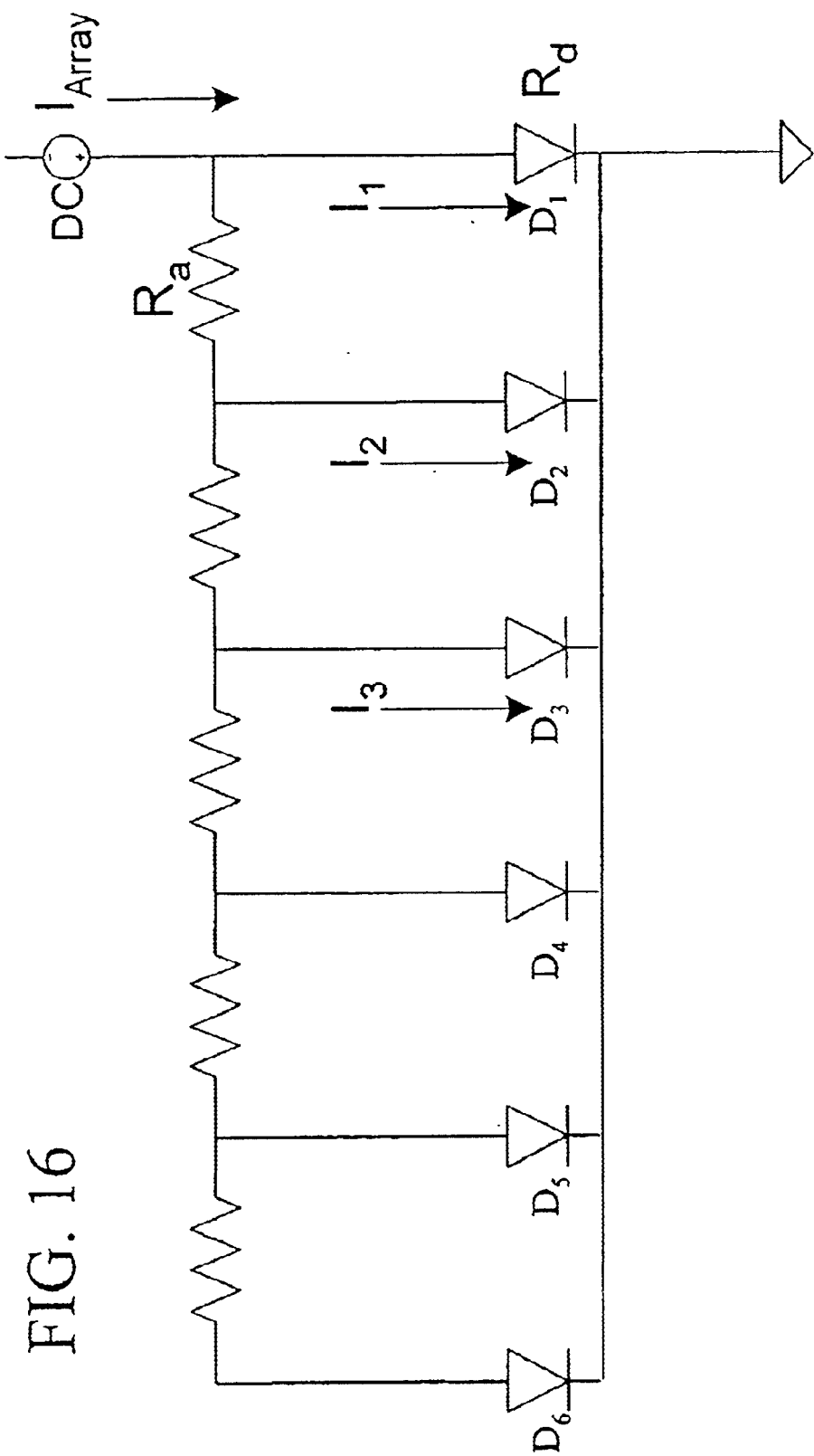
FIG. 16 is a simplified circuit diagram of a DC current source powering a diode array with a resistive anode contact in accordance with an exemplary embodiment of the present invention.
Figure 17:
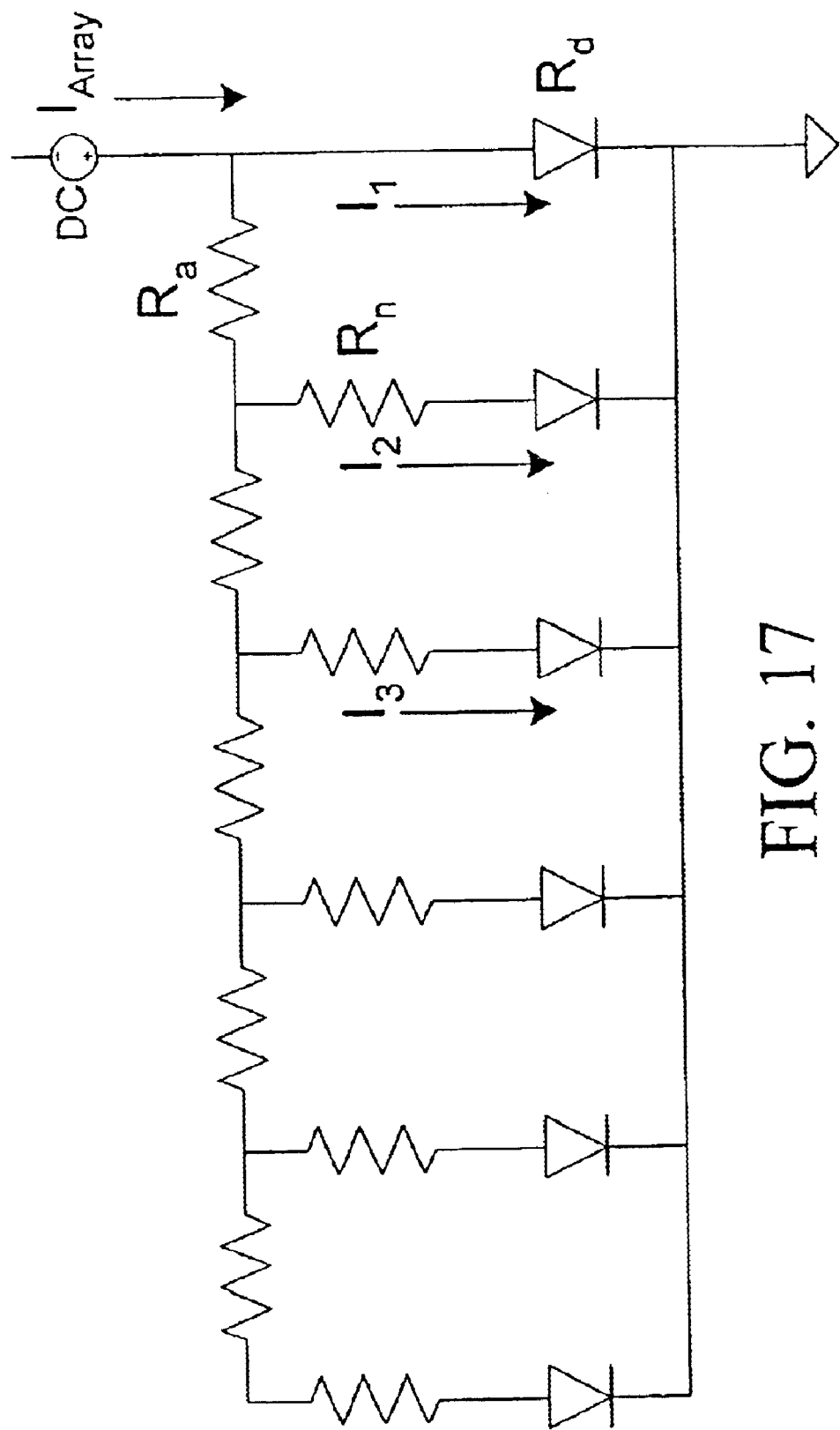
FIG. 17 is a simplified circuit diagram of a DC current source powering a diode array with a resistive anode contact and with a parallel resistor network in accordance with an exemplary embodiment of the present invention.

For example, referring to FIG. 16, a device array may have a common anode path that is not an equipotential path, but a to path with a finite resistance between diodes, $R_a$. In practice, even if the diode resistance is greater than the path resistance ($R_d > R_a$) non-uniform current may be supplied to the devices under test. In this instance the drive current may gradually increase for diodes closest to the current source, such as for example $D_1$ and $D_2$ and decrease for diodes further removed from the source, such as for example $D_5$ and $D_6$. If, however, a parallel network resistance is used, where $R_n + R_d >> R_a$ as illustrated in FIG. 17, then a more uniform current will be supplied to each channel or device in the array.

Figure 18:
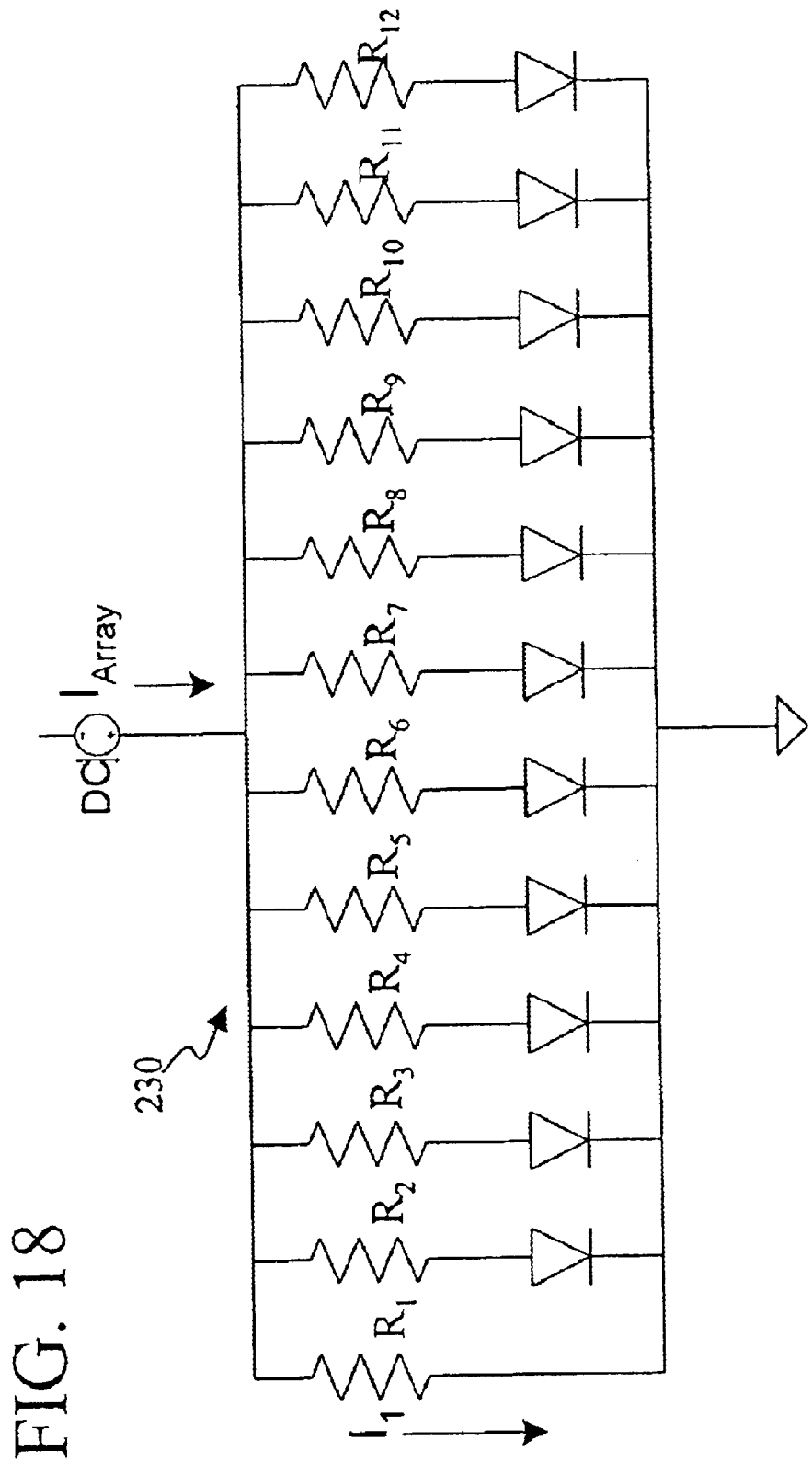
FIG. 18 is a simplified circuit diagram of a DC current source powering a diode array in series with a resistor network wherein a first diode is shorted in accordance with an exemplary embodiment of the present invention.

Resistor networks may also be employed to reduce the effects of open circuits and short circuits on the uniformity of current injection across the array. For example, FIG. 18 is a simplified circuit diagram of an array bias system 230 where device $D_1$ in channel one is a short circuit that may have been created before or during burn-in of the wafer. For the purposes of illustration, parallel resistors $R_1$–$R_{12}$ may be assumed to have a resistive value of 200 Ω and the differential resistance of each diode may be assumed to be 100 Ω.

In this instance then the total series resistance of each channel is 300 Ω and the current through channel one will be 300/200, or 50% greater than the drive current supplied to the other channels (i.e. $D_2$–$D_{12}$). In operation the additional current supplied to channel one will be drawn from the other eleven channels. For example, if the supplied current $I_{Array}$ is 120 mA, or 10 mA/channel, then the channel one drive current will be approximately 15 mA. In addition, the drive current for each of the other channels will be approximately 9.54 mA (i.e. 10–5/11) or approximately 5% less than that which would be supplied if diode $D_1$ was not a short circuit.

Figure 19:
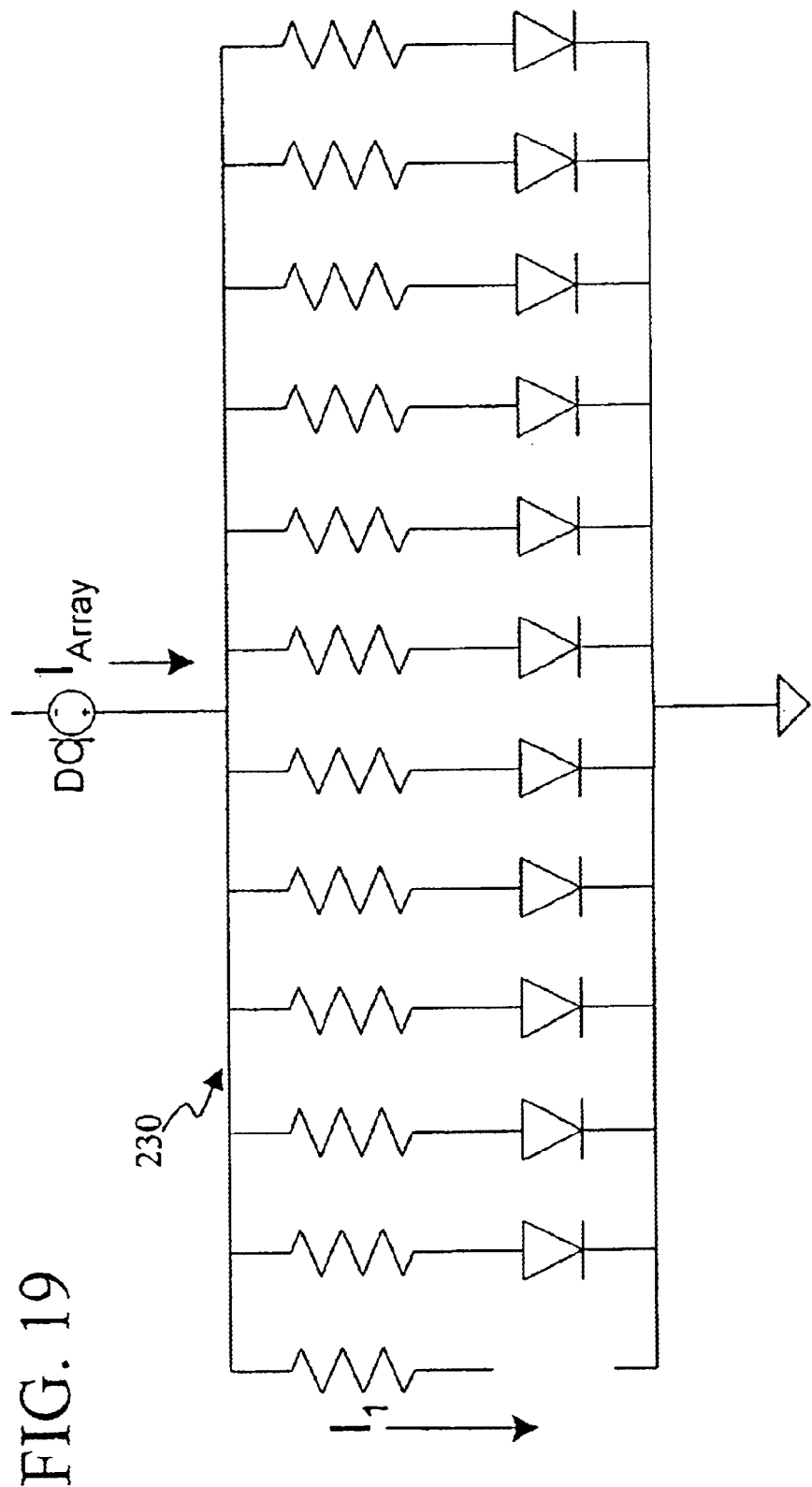
FIG. 19 is a simplified circuit diagram of a DC current source powering a diode array in series with a resistor network wherein a first diode of the array is an open circuit in accordance with an exemplary embodiment of the present invention.

Similarly, referring to FIG. 19, if diode $D_1$ is an open circuit, then the current through channel one will be zero. In this instance the current that is not supplied to channel one results in an increase of the drive currents for the other eleven channels. If the supplied current $I_{Array}$ is again assumed to be 120 mA (10 mA/channel), then the drive current for each of the other channels will increase to 10.9 mA (i.e. (10+10/11)mA). Thus the drive current for each of the functioning channels increases approximately 9% when one of the diode devices in the array is an open circuit.

Thus, the described exemplary parallel resistor network for providing uniform current distribution may be used to maintain a substantially constant stress condition (in this instance uniform current source) even if one of the devices in the array is a short or an open circuit. One of skill in the art will appreciate that for a fixed number of failed devices, deviations in the stress condition for the operating devices will improve as the number of devices that are electrically coupled together increases.

In addition, for a fixed number of failed devices, the described exemplary embodiment will supply a more uniform current to each of the functioning devices if the value of the network resistors increases relative to the differential resistance of the devices under test. Further, if open or short circuits are detected prior to burn-in (i.e. prior to applying the stress current), then the current for the remaining channels may be adjusted accordingly.

In the above example, an illustrative 12-element array of diodes was electrically coupled together through a resistor network. However, one of skill in the art will appreciate that the present invention is not limited to the burn-in of a particular number of devices. To the contrary the described exemplary process may be utilized to electrically couple and burn-in a limitless number of devices. For example, as illustrated in FIGS. 7–8 and 9–11 single level or multi-level temporary interconnection layers may be designed to burn in an entire wafer of devices or a limitless number of arrays of devices.

In either case, the described exemplary parallel resistor network may be integrated into the single connection layer or the first interconnection layer in the two level system to mitigate the effects of device short circuits or open circuits. However, for a single interconnection layer scheme as illustrated, for example, in FIGS. 7–8, a short circuit between the anode and cathode contacts of any one of the devices in the interconnection layer will result in a wafer level failure during burn-in if left uncorrected.

Figure 11:
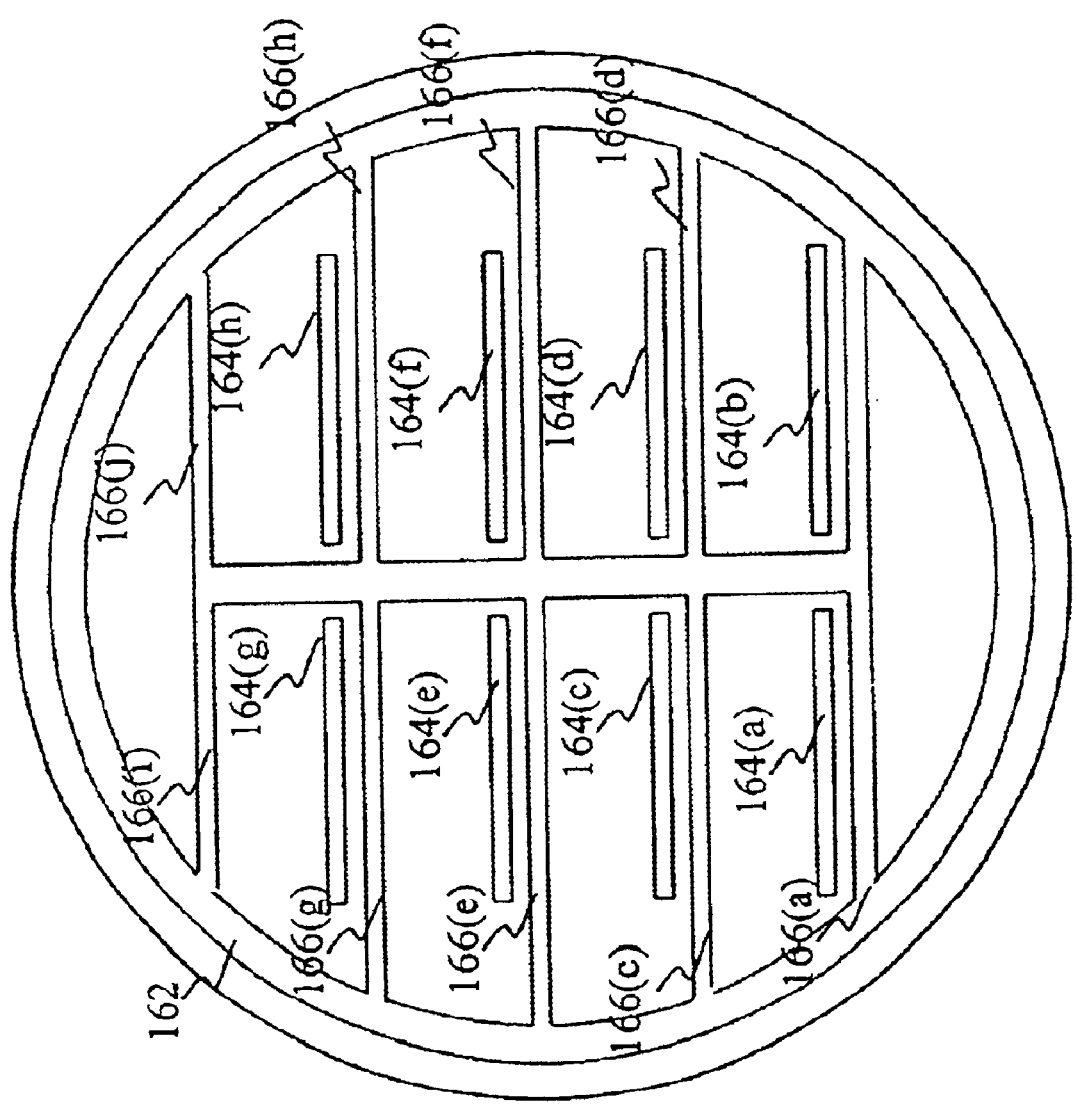
FIG. 11 is a wafer level top view of a first temporary interconnect layer in a two level interconnect scheme for separate, simultaneous connection to the electrodes of the light emitting device of FIG. 5, in accordance with an exemplary embodiment of the present invention.
Figure 20:
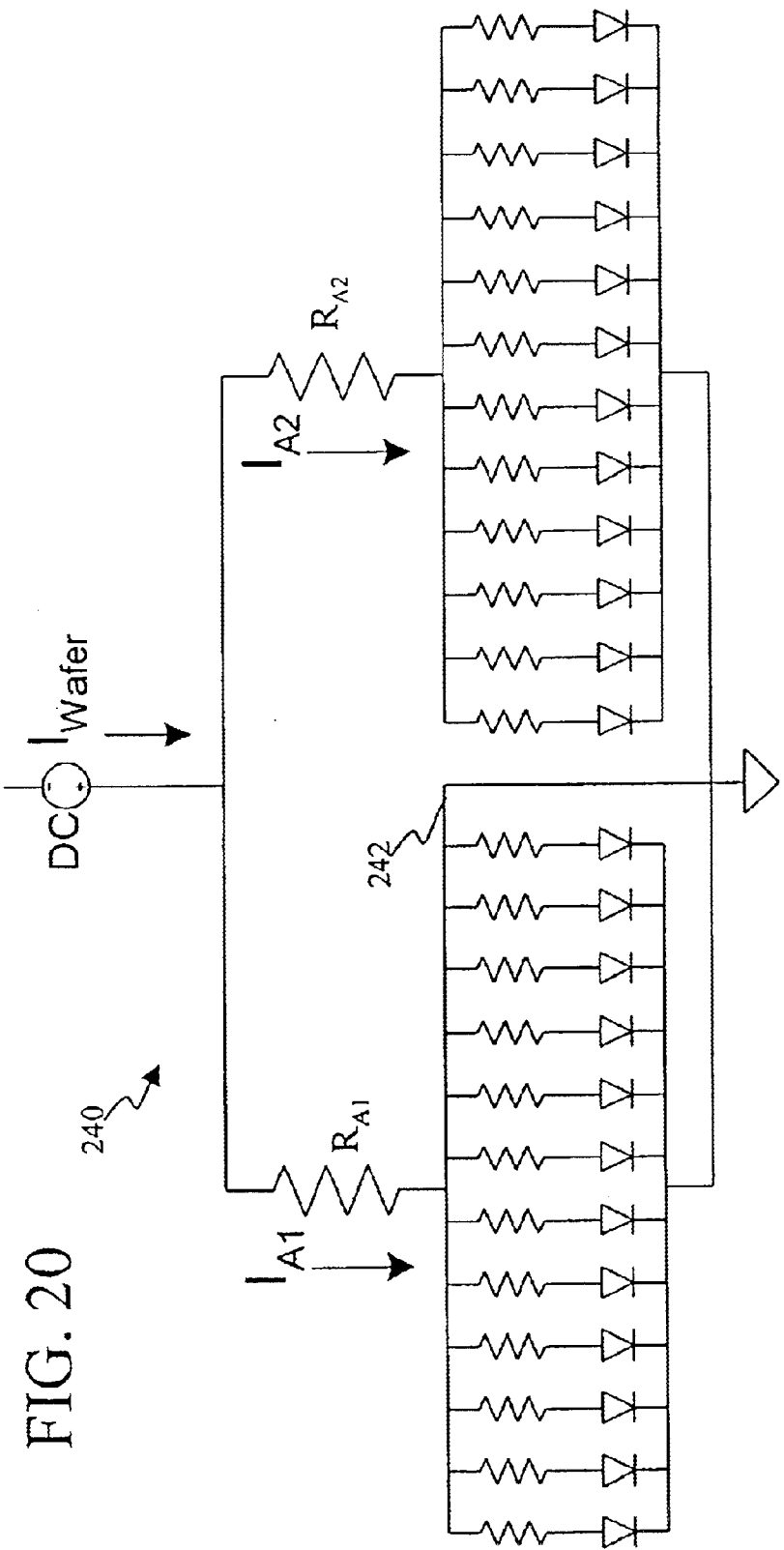
FIG. 20 is a simplified circuit diagram of a two-level temporary interconnect scheme with one of the arrays shorted in accordance with an exemplary embodiment of the present invention

FIG. 20 illustrates a simplified electrical schematic 240 of two arrays that have been contacted in accordance with the described exemplary two level interconnection scheme as illustrated in FIGS. 9–11. In this example it is assumed that the anode and cathode of one of the arrays ($A_1$) is short circuited 242 in the first level interconnect layer. In this instance the addition of array resistor $R_{A1}$ limits the current drawn by array $A_1$ thereby providing a more uniform drive current to the second array $A_2$. Therefore, a wafer level, parallel resistive network reduces the level of variation in the current supplied to each array as a result of the formation of an array level short circuit in the first metal interconnection layer.

In accordance with an exemplary process, a resistor in a channel within an array as well as an array level resistor may be formed, for example, by patterning the metal between the common anode contact traces and the anode contacts in the first and second metal interconnection layers respectively. For example, the metal interconnection layer between the common contact trace 302 and the bond pad may be patterned into a long, thin feature 300, such as, for example, the serpentine pattern illustrated in the plan view of FIG. 21.

Figure 21:
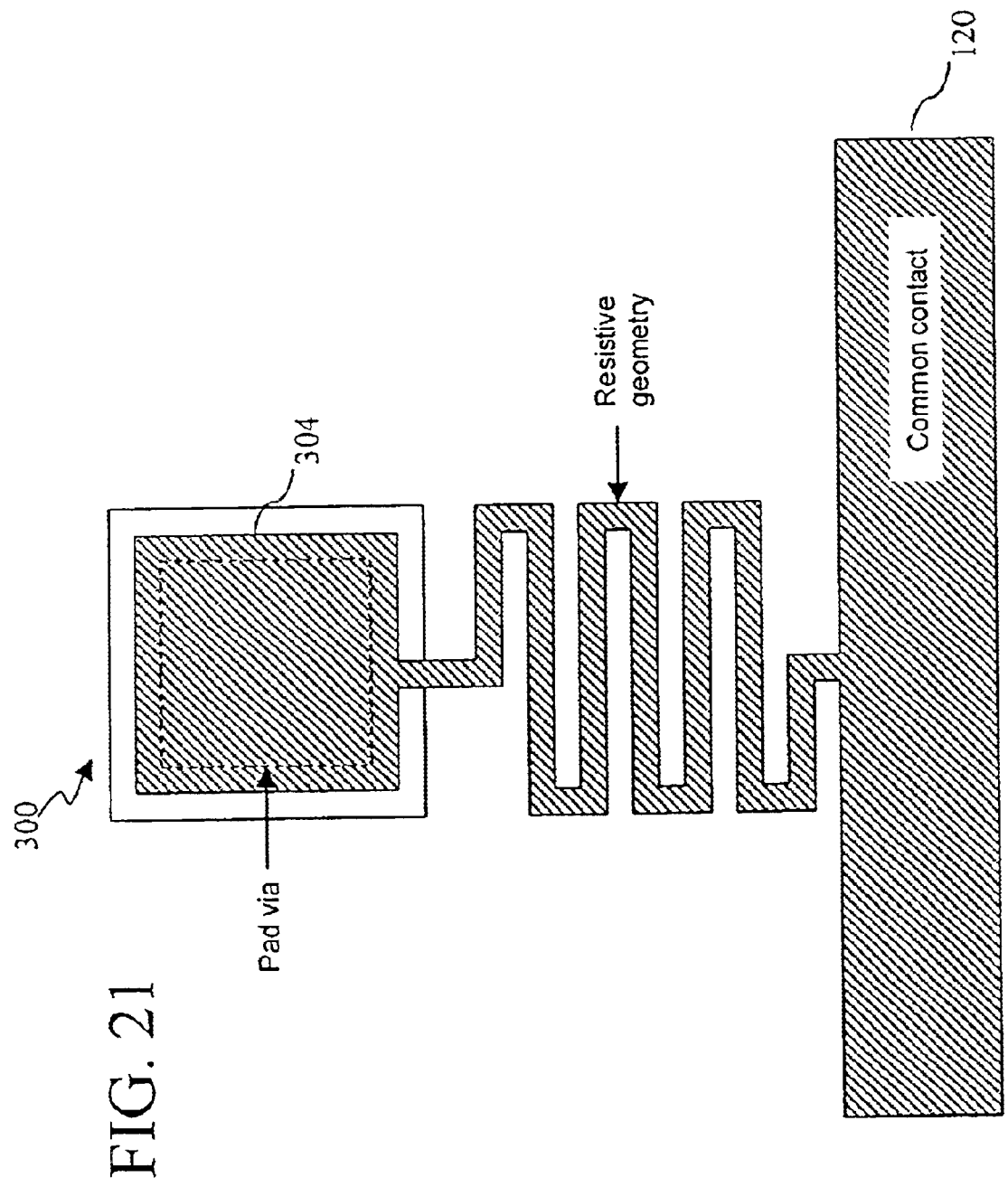
FIG. 21 is a top view of mask layout for forming a resistor element between common contact and DUT in a metal interconnection layer accordance with an exemplary embodiment of the present invention.

The described exemplary burn-in process is not however, limited to resistors formed from patterned metal as illustrated in FIG. 21. Rather, integrated resistors may also be formed in accordance with a variety of other techniques. For example, an integrated resistor may be formed by the integration of a resistive bridge 330 in the gap between the conductive interconnect layer 326(*a*) that contacts for example an upper electrode and the common contact trace the couples groups of upper electrodes together 328.

Figure 22:
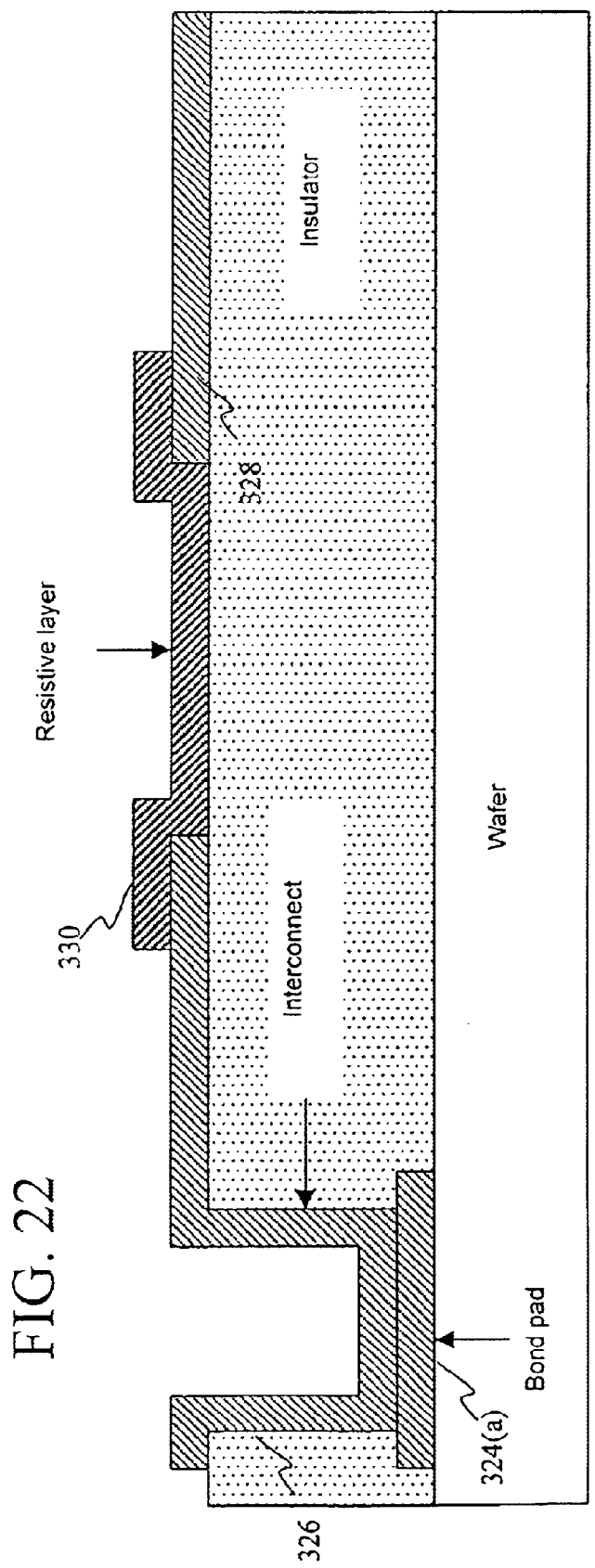
FIG. 22 is a cross section of a resistor element formed by bridging between the common contact and the device under test in accordance with an exemplary embodiment of the present invention.

In an exemplary embodiment the material may take the form of an evaporated semiconductor, such as polysilicon, or a resistive metal, such as titanium. A cross section of an exemplary bridge resistor is illustrated in FIG. 22. However, in the described exemplary process the resistors in the parallel resistor network preferably behave as an Ohmic, i.e. have a linear I–V characteristic, so as not to create non-linearities in the voltage or non-uniformities in the current.

In another wafer level burn-in process, a series of fuses in the temporary interconnection scheme may be utilized to remove short circuits or any other undesirable devices or arrays from the burn-in population. For example, in accordance with an exemplary process a fuse may be used to remove arrays that do not comply with a particular specification from the burn-in population. The described exemplary process therefore reduces the number of devices to be stressed and relaxes the power and heat dissipation requirements for the burn-in system.

Electrically, a fuse would look much like any of the resistors of FIG. 20. Physically, a fuse would comprise a resistive element able to carry the required amount of stress current, but not two to three times that amount. As in the case of the resistors illustrated in FIGS. 21 and 22, a fuse may be formed from narrow geometric features in a conductive layer, or by bridging a gap in a conductive layer with a resistive material. In operation a fuse may be blown by contacting the metal on either side of the fuse with a pair of probes, so as not to bias the DUT, and applying the amount of current necessary to cause electromigration or evaporation of the fuse material, thus creating an open circuit.

Figure 23:
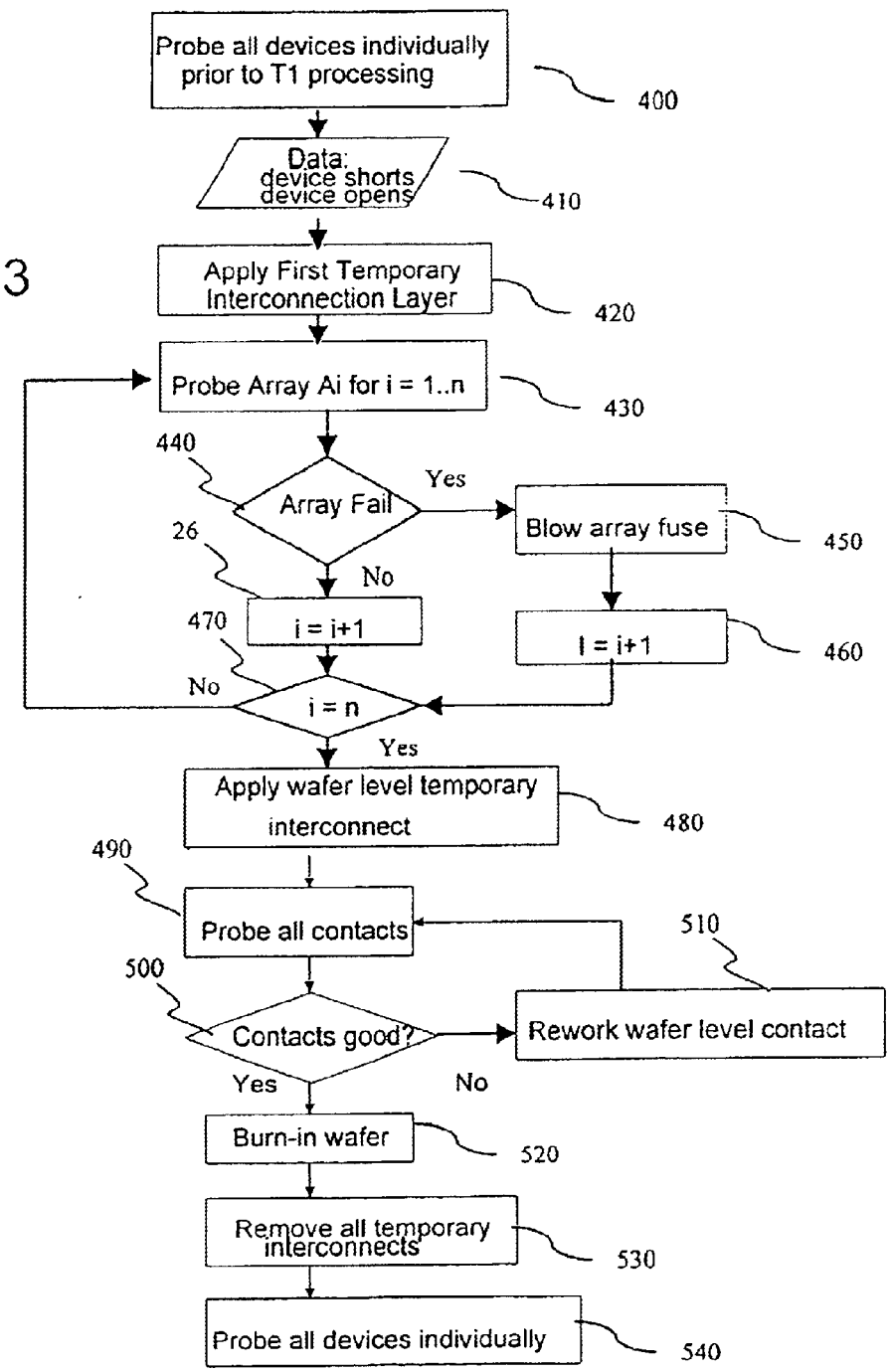
FIG. 23 is a flow chart illustrating an exemplary implementation of a process for burning a whole wafer of active semiconductor devices.

An exemplary wafer level burn-in process is illustrated in the flow chart of FIG. 23. In accordance with an exemplary process, un-stressed device data may be collected at time zero 400 to characterize the state of each device. For example time zero testing may be used to determine which devices are good, which devices are open circuited or short circuited or to determine which devices are not comply with a particular device specification 410.

A first temporary interconnect layer may now be formed as previously described 420. If a single layer interconnect scheme is being used, the single interconnect layer may be appropriately patterned to contact all of the devices and the wafer is ready for burn-in. If a two-layer interconnect scheme is being used the first interconnect layer may be appropriately patterned to form the array-level interconnect. At this point a first of for example, n arrays, may be individually tested 430 to identify interconnection level short circuits or open circuits 440. If a fuse technology is being employed, the fuse of a failed array may be blown 40. The array under test is incremented 460 and if the last array has not been tested 470 the next array is probed.

For a two-layer interconnect, the second temporary interconnection layer is then applied 480 and the contacts are probed 490. In general, this level will have very few electrodes. Should an open or short be found at this level 500, the second level metal interconnection level may be reworked 510 and the contacts may be probed again to verify their integrity. The wafer may then be burned in 520 with a substantially uniform current driving each of the operating devices (i.e. not the arrays whose fuses were blown). In all cases the burn-in stress condition may be adjusted according to the device data taken previously. Finally, the temporary interconnects are removed 530 and the devices tested individually for burn-in failures 540.

One of skill in the art will appreciate that the present invention is not limited to the processing of particular light emitting devices. Rather, the present invention may be readily used to stress or burn-in any semiconductor wafer comprising a plurality of active devices each of which has an anode and cathode contact. One of skill in the art will further appreciate that the present invention in not limited to the particular interconnection contact schemes discloses. Rather, a variety of modifications may be made to the shape of the interconnection layers or the number of interconnection layers used without deviating from the scope of the present invention.

In addition, although exemplary wafer processing methods as well as an apparatus for use therein have been described, they should not be construed to limit the scope of the appended claims. Those skilled in the art will understand that various modifications may be made to the described embodiment. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A method of simultaneously burning in a plurality of active semiconductor surface emitting laser devices on a wafer comprising the steps of:

providing a wafer having a plurality of active semiconductor surface emitting laser devices formed thereon, each of said laser devices having a first electrode on a first side of the wafer and a second electrode on a second side of the wafer;

depositing a temporary insulating layer on a first side of said wafer;

selectively forming vias through said insulating layer to expose said first electrode of at least two of said plurality of laser devices;

depositing a temporary electrically conductive interconnect layer over said insulating layer whereby said first electrodes of said at least two of said plurality of active laser devices are coupled together to provided with a common electrical contact;

applying a predetermined power to said interconnect layer whereby said predetermined power is simultaneously applied to said first electrodes of said at least two of said plurality of active laser devices;

identifying defective ones of said plurality of active laser devices; and completely removing said insulating layer and said temporary interconnect layer.

2. The method of claim 1 wherein said step of depositing said interconnect layer further comprises the step of processing said interconnect layer to form one or more common contact traces, wherein said one or more contact traces electrically couple together said first electrodes of said at least two of said plurality of active.

3. The method of claim 2 wherein said step of processing further comprises forming a resistor between said one or more contact traces and said first electrodes.

4. The method of claim 3 wherein said step of forming said resistor comprises forming a resistive bridge.

5. The method of claim 2 wherein said step of processing further comprises forming a fuse between said one or more contact traces and said first electrodes.

* * * * *